US009156674B2

(12) United States Patent  
Stalford

(10) Patent No.: US 9,156,674 B2
(45) Date of Patent: Oct. 13, 2015

(54) MICRO TRANSPORT MACHINE AND METHODS FOR USING SAME

(75) Inventor: Harold Stalford, Norman, OK (US)

(73) Assignee: MicroZeus, LLC, Dallas, TX (US)

( * ) Notice: Subject to any disclaimer, the term of this patent is extended or adjusted under 35 U.S.C. 154(b) by 2075 days.

(21) Appl. No.: 11/757,341

(22) Filed: Jun. 1, 2007

(65) Prior Publication Data

US 2008/0087478 A1   Apr. 17, 2008

Related U.S. Application Data

(60) Provisional application No. 60/810,666, filed on Jun. 2, 2006.

(51) Int. Cl.
| | |
|---|---|
| *B60K 31/00* | (2006.01) |
| *B81B 3/00* | (2006.01) |
| *H02N 1/00* | (2006.01) |

(52) U.S. Cl.
CPC .............. *B81B 3/0024* (2013.01); *H02N 1/008* (2013.01); *B81B 2201/032* (2013.01); *B81B 2201/034* (2013.01); *B81B 2201/037* (2013.01); *B81B 2201/051* (2013.01)

(58) Field of Classification Search
CPC ............ F01B 29/00; B21B 1/14; H01L 41/08
See application file for complete search history.

(56) References Cited

U.S. PATENT DOCUMENTS

| | | |
|---|---|---|
| 2,998,805 A | 9/1961 | Usab |
| 3,136,891 A | 6/1964 | Graftieaux et al. |
| 4,139,167 A | 2/1979 | Osanai |
| 4,323,805 A | 4/1982 | Caby et al. |
| 4,426,158 A | 1/1984 | Müller et al. |
| 5,189,323 A | 2/1993 | Carr et al. |
| 5,254,893 A | 10/1993 | Ide |
| 5,296,775 A | 3/1994 | Cronin et al. |
| 5,449,493 A | 9/1995 | Rolugawa |
| 5,631,514 A | 5/1997 | Garcia et al. |
| 5,710,466 A | 1/1998 | Allen et al. |
| 5,780,288 A | 7/1998 | Rohwer |
| 5,874,798 A | 2/1999 | Wiegele et al. |
| 5,959,376 A | 9/1999 | Allen |
| 6,121,553 A | 9/2000 | Shinada et al. |
| 6,175,170 B1 | 1/2001 | Kota et al. |
| 6,179,596 B1 | 1/2001 | Weisener et al. |

(Continued)

FOREIGN PATENT DOCUMENTS

| | | |
|---|---|---|
| DE | 10 2005 010 279 A1 | 9/2006 |
| EP | 472150 A2 | 2/1992 |

(Continued)

OTHER PUBLICATIONS

Notification Concerning Transmittal of International preliminary Report on Patentability for PCT application No. PCT/US2007/070359 filed Jun. 4, 2007 and mailed Dec. 18, 2008 (9 pages).

(Continued)

*Primary Examiner* — Jeffrey J Restifo
*Assistant Examiner* — Erez Gurari
(74) *Attorney, Agent, or Firm* — Fish & Richardson P.C.

(57) ABSTRACT

A micro transport machine may include a substrate and a movable device comprising a drive component responsive to a wireless power source. The movable device is operable to move between a plurality of disparate areas on the substrate.

11 Claims, 29 Drawing Sheets

(56) References Cited

U.S. PATENT DOCUMENTS

| | | | |
|---|---|---|---|
| 6,211,599 | B1 | 4/2001 | Barnes et al. |
| 6,240,312 | B1* | 5/2001 | Alfano et al. .............. 600/476 |
| 6,313,562 | B1* | 11/2001 | Barnes et al. .............. 310/306 |
| 6,366,186 | B1 | 4/2002 | Hill et al. |
| 6,392,313 | B1 | 5/2002 | Epstein et al. |
| 6,616,326 | B2 | 9/2003 | White |
| 6,655,964 | B2 | 12/2003 | Fork et al. |
| 6,848,175 | B2 | 2/2005 | Fork et al. |
| 6,903,861 | B1 | 6/2005 | Allen |
| 6,922,327 | B2 | 7/2005 | Chua et al. |
| 6,973,365 | B1 | 12/2005 | Mercanzini |
| 6,979,936 | B1 | 12/2005 | Ganor et al. |
| 7,018,575 | B2 | 3/2006 | Brewer et al. |
| 7,025,619 | B2 | 4/2006 | Tsui et al. |
| 7,036,769 | B2 | 5/2006 | Wood |
| 7,044,653 | B2 | 5/2006 | Reis |
| 7,096,568 | B1 | 8/2006 | Nilsen et al. |
| 7,109,638 | B2 | 9/2006 | Kitahara et al. |
| 7,159,842 | B1 | 1/2007 | Taylor et al. |
| 7,196,454 | B2 | 3/2007 | Baur et al. |
| 7,201,185 | B2 | 4/2007 | Poppe et al. |
| 7,220,973 | B2 | 5/2007 | Yu et al. |
| 7,378,777 | B2 | 5/2008 | Moteki et al. |
| 7,423,364 | B2 | 9/2008 | Williams et al. |
| 7,505,373 | B2 | 3/2009 | Paratte et al. |
| 7,636,277 | B2 | 12/2009 | Minotti et al. |
| 7,698,818 | B2 | 4/2010 | Voegele et al. |
| 2002/0041729 | A1 | 4/2002 | Mastromatteo et al. |
| 2002/0181886 | A1 | 12/2002 | Fischer et al. |
| 2003/0099763 | A1 | 5/2003 | Sandhage |
| 2003/0183008 | A1 | 10/2003 | Bang et al. |
| 2003/0211761 | A1 | 11/2003 | Fork et al. |
| 2004/0119354 | A1 | 6/2004 | Takada et al. |
| 2004/0126254 | A1 | 7/2004 | Chen et al. |
| 2005/0025643 | A1 | 2/2005 | Lin |
| 2005/0082950 | A1 | 4/2005 | Zakoji |
| 2005/0270135 | A1 | 12/2005 | Chua et al. |
| 2006/0042381 | A1 | 3/2006 | Still |
| 2006/0098047 | A1 | 5/2006 | Silverbrook |
| 2006/0228094 | A1 | 10/2006 | Alasaarela et al. |
| 2006/0234412 | A1 | 10/2006 | Lazaroff |
| 2007/0087474 | A1 | 4/2007 | Eklund et al. |
| 2007/0103029 | A1 | 5/2007 | Fedder et al. |
| 2007/0103264 | A1 | 5/2007 | Yang |
| 2012/0167377 | A1 | 7/2012 | Harlold |

FOREIGN PATENT DOCUMENTS

| | | |
|---|---|---|
| GB | 1388119 A | 3/1975 |
| JP | 03292690 A | 12/1991 |
| JP | 2001148461 A | 5/2001 |
| JP | 2003120663 A | 4/2003 |
| JP | 2003148661 A | 4/2003 |
| WO | WO 2007/143623 | 12/2007 |

OTHER PUBLICATIONS

Integrated MicroElectroMechanical Technologies; printed May 14, 2007 http://mems.sandia.gov/about/electro-mechanical.html; (3 pages).

Notification of Transmittal of the International Search Report and the Written Opinion of the International Searching Authority of Application No. PCT/US2007/070359; filed Jun. 4, 2007 and mailed Dec. 24, 2007—Corrected Version (10 pages).

Legtenberg, Rob et al. "Electrostatic Microactuators with Integrated Gear Linkages for Mechanical Power Transmission", In: MEMS '96, Proceedings 'An Investigation of Micro Structures, Sensors, Actuators, Machines and Systems', IEEE, The Ninth Annual International Workshop on Feb. 11-15, 1996, pp. 204-209.

Szabo, F.R. and Kladitis, P.E., "Design, Modeling and Testing of Polysilicon Optothermal Actuators for Power Scavenging Wireless Microrobots", MEMS, NANO and Smart Systems, ICMENS 2004, Proceedings of International Conference on Aug. 25-27, 2004, pp. 446-452.

Office Action issued in related U.S. Appl. No. 11/757,343 on Jan. 6, 2011; 12 pages.

Office Action Issued in related U.S. Appl. No. 12/470,474 on Feb. 16, 2011; 16 pages.

Office Action Issued in related U.S. Appl. No. 11/757,344 on Jun. 9, 2011; 12 pages.

Office Action Issued in related U.S. Appl. No. 11/757,313 on Aug. 2, 2011; 11 pages.

Advisory Action Issued in related U.S. Appl. No. 11/757,344 on Sep. 9, 2011; 3 pages.

Office Action Issued in related U.S. Appl. No. 11/757,321 on Oct. 20, 2011; 9 pages.

Advisory Action Issued in related U.S. Appl. No. 11/757,321 on Jan. 3, 2012; 4 pages.

Office Action Issued in related U.S. Appl. No. 11/757,313 on Mar. 1, 2012; 14 pages.

Office Action issued in related U.S. Appl. No. 11/757,331 on Sep. 9, 2009; 15_pages.

Office Action issued in related U.S. Appl. No. 11/757,331 on Feb. 26, 2010; 7 pages.

Office Action issued in related U.S. Appl. No. 11/757,343 on Jul. 24, 2009; 19 pages.

Office Action issued in related U.S. Appl. No. 11/757,343 on Feb. 28, 2010; 19 pages.

Office Action issued in related U.S. Appl. No. 11/757,343 on Sep. 9, 2010; 21 pages.

Office Action issued in related U.S. Appl. No. 11/757,344 on Dec. 30, 2009; 18 pages.

Office Action issued in related U.S. Appl. No. 11/757,344 on Sep. 15, 2010; 10 pages.

Office Action issued in related U.S. Appl. No. 11/757,321 on Jan. 21, 2011; 20 pages.

Caldarelli-Stefano, R., et al., *Use of Magnetic Beads for Tissue DNA Extraction and IS6110 Mycrobacterium Tuberculosis PCR*, J. Clin Pathol: Mol Pathol, Jan. 19999, pp. 158-166.

Carpita, Nocholas C., *Tensile Strength of Cell Walls of Living Cells*, Plant Physiol, vol. 79, Jun. 1985, pp. 485-488.

Choi, Jin-Woo, et al., *Development and Characterization of Mcrofluidic Devices and Systems for Magnetic Bead-Based Biochemical Detection*, Biomedical Microdevices, vol. 3, No. 3, (2001), pp. 191-200.

Gijis, martin A.M., *Magnetic Bead Handling ON-Chip: New Opportunities for Analytical Applications*, Microfluid Nanoflid, Oct. 2004; vol. 1, pp. 22-40.

Kim Changhyun and Wise, Kensall D., *A 64-Site Multishank CMOS Low-Profile Neutral Stimulating Probe*. IEEE J. of Solid-State Circuits, vol. 31, No. 9, Sep. 1996, pp. 1230-1238.

Kovacs, Gregory T. A., et al. *Regeneration Microelectrode Array for Peripheral Nerve Recording and Stimulation*, IEEE Transactions on Biomedical Engineering, vol. 39, No. 9, Sep. 1992, pp. 893-902.

Lee, H., et al., *Manipulation of Biological Cells Using a Microelectromagent Matrix*, Applied Physics Letters, vol. 85, No. 6, Aug. 2004, pp. 1063-1065.

Maulf, Nadim I., et al., *Medical Applications of MEMS*, WESCON 1995, Nov. 7-9, 1995, pp. 300-306.

Maulf, Nadim I., et al., *Recent Advances in Medical Applications of MEMS*, WESCON 1996, Oct. 22-24, 1996, pp. 60-63.

Mijailovich, Srboljub M., et al. *A Finite Element Model of Cell Deformation Durinq Magnetic Bead Twisting*, J. Appl. Physiol, vol. 93, Jun. 2002, pp. 1429-1436.

Najafi, Khalil, *Solid-State Microsensors for Cortical Nerve Recordings*, IEEE Engineering in Medicine and Biology, Jun./Jul. 1994, pp. 375-387.

Rebello, Keith J., *Applications of MEMS in Surgery*, Proceedings of the IEEE, vol. 92, No. 1, Jan. 2004, pp. 43-55.

Regehr, Wade G., et al., *A Long-Term In Vitro Silicon-Based Microelectrode-Neuron Connection*, IEEE Transactions on Biomedical Engineering, vol. 35, No. 12, Dec. 1988, pp. 1023-1031.

Smith, Steven B., et al., *Direct Mechanical Measurements of the Elasticity of Single DNA Molecules by Using Magnetic Beads*, Science, vol. 258, Nov. 1992, pp. 1122-1126.

(56) References Cited

OTHER PUBLICATIONS

Final Corrected Version—International Search Report and Written Opinion of the International Searching Authority of Application No. PCT/US2007/070359; filed Jun. 4, 2007 and mailed Dec. 24, 2007—(12 pages).
Popa, D.O. and Stephanou, H.E., "Micro and Meso Scale Robotic Assembly", SME Journal of Manufacturing Processes, vol. 6, No. 1, 2004, pp. 52-71.
Specification of U.S. Appl. No. 11/757,313, filed Jun. 1, 2007, entitled *Methods and Systems for Micro Machines* (71 pages).
Specification of U.S. Appl. No. 11/757,321, filed Jun. 1, 2007, entitled *Methods and Systems for Micro Transmissions* (68 pages).
Specification of U.S. Appl. No. 11/757,331, filed Jun. 1, 2007, entitled *Micro Rotary Machine and Methods for Using Same* (69 pages).
Specification of U.S. Appl. No. 11/739,716, filed Apr. 25, 2007, entitled *Microelectromechanical Pump Utilizing Porous Silicon* (41 pages).
Specification of U.S. Appl. No. 11/746,147, filed May 9, 2007, entitled *Microelectromechanical Tunable Inductor* (34 pp.).
Specification of U.S. Appl. No. 11/757,343, filed Jun. 1, 2007, entitled *Methods and Systems for Positioning Micro Elements* (69 pages).
Specification of U.S. Appl. No. 11/757,344, filed Jun. 1, 2007, entitled *Methods and Systems for Micro Bearings* (68 pages).
Office Action issued in related U.S. Appl. No. 11/757,321 on May 13, 2014; 7 pages.
Office Action issued in related U.S. Appl. No. 13/647,218 on Jul. 17, 2014; 6 pages.
Office Action issued in related U.S. Appl. No. 13/417,564 on Jul. 29, 2014; 12 pages.
Office Action Issued in related U.S. Appl. No. 11/757,313 on Sep. 14, 2012; 12 pages.
Office Action Issued in related U.S. Appl. No. 11/757,321 on Feb. 15, 2013; 7 pages.
Office Action Issued in related U.S. Appl. No. 13/448,039 on Feb. 26, 2013; 9 pages.
Office Action Issued in related U.S. Appl. No. 11/757,313 on Mar. 26, 2013; 11 pages.
Office Action Issued in related U.S. Appl. No. 13/417,564 on May 16, 2013; 10 pages.
Office Action Issued in related U.S. Appl. No. 11/757,321 on Sep. 17, 2013; 11 pages.
Office Action Issued in related U.S. Appl. No. 13/448,039 on Oct. 10, 2013; 15 pages.
Office Action issued in related U.S. Appl. No. 13/647,218 on Oct. 21, 2013; 10 pages.
Office Action Issued in related U.S. Appl. No. 11/757,313 on Oct. 29, 2013; 11 pages.
Office Action issued in related U.S. Appl. No. 13/417,564 on Feb. 5, 2014; 6 pages.
Office Action issued in related U.S. Appl. No. 13/417,564 on Nov. 26, 2014; 5 pages.
Allen, James J. et al., "*Micromachine Wedge Stepping Motor*", Sandia National Laboratories, Intelligent Micromachine Dept., 1998 ASME International Mechanical Egineering Congress and Exposition, Anaheim, CA. Nov. 15-20, 1998. (6 pages).
Andersson, Helene, van den Berg, Albert, "*Microfluidic devices for collomics: a review*", copyright 2003 Elsevier Science, (11 pages). <http://bios.ewi.utwente.nl.publications/bios/20003/ pdffiles2003/Microfluidicdevicesforcellomics>.
Barnes, Stephen M., et al., "*Torsion Racheting Actuating System*", Sandia National Laboratories, Albuquerque, NM, Technical Proceedings of the 2000 International Conference on Modeling and Simulation of Microsystems, Chapter 6: Characterization, Parameter Extraction, Calibration, Mar. 27-29, 2000, pp. 273-276.
Conference Proceedings entitled "*12th International Congress of Biorheology and 5th International Conference on Clinical Hemorheology*", Chongquig China, May 30, 2005—Jun. 3, 2005, Scientific Program, copyright 2005—IOS Press, Biorheology 42, (14 pages).
Cusin, P., "*Compact and precise positioner based on the Inchworm principal*", Faculty of Science and Engineering, Ritsumelkan University, Kusatsu, Shiga, Japan, J. Micromech. Microeng. vol. 10, 2000, received Apr. 18, 2000. pp. 516-521.
Dagel, D.J., et al., "*Out-of-plane, rotary micromirrors for reconfigurable photonic applications*", Sandia National Laboratories, Albuquerque, NM, Proceedings of SPIE vol 4983, Pub. 2003, pp. 114-121.
DENSO Micro-Car, DENSO North America, from the Guinness World Record Internet: <http://www.densocorp-na.com/corporate/gwr.html>(2 pages)—date unknown.
"*DNM—Do-Nothing Machine*" located at <http://www.folktoys.com/atmechanical.htm>—date unknown.
Fischer, Kayte,"*Batteries not Included, Big Steps in Small-Scale Energy Sources*", Berkeley Science Review, Issue 12, pp. 25-28. <http://sciencereview.berkeley.edu/articles/issue12/smallenergy.pdf>.
Fukushige, T., et al., "*Large-output-force out-of-plane MEMS actuator array*", Proceedings of SPIE International Symposium on Microelectronics, MEEMS. and Nanotechnology, The University of western Australia, Perth, Australia, Dec. 9-12, 2003 (10 pages).
Ho Nam Kwon, et al., "*Characterization of a Micromachines Inchworm Motor with Thermoelastic Linkage Actuators*", Dept. of Mechatronics, K-JIST, Gwangju, Korea, IEEE, 2002, pp. 586-589.
Ide, Russell D., Abstract entitled "*Shaft Support Assembly for USe in a Polygon Mirror Drive Mtor*", from U.S. Pat. No. 5,254,893 issued Oct. 19, 2007(2 pages).
Keating, D.J., et al., "*Numerical Simulation of Micro-Assembly of MEMS Devices and Post Assembly Electromechanical Actuation*", IntelliSuite User's Manual, IntelliSense Corporation, 1999 (8 pages).
Kolesar, Ed, Lecture Notes entitled "*Introduction to Microeletromechanical Systems (MEMS)—Lecture 1 Topics*", Texas Christian University, Department of Engineering, Summer Session, approx. May through Aug. 2005. (18 pages).
Kolesar, Ed, Lecture Notes entitled "*Introduction to Microeletromechanical Systems (MEMS)—Lecture 2 Topics*", Texas Christian University, Department of Engineering, Summer Session, approx. May through Aug. 2005. (17 pages).
Konishi, Satoshi, et al., "*Electrostatically Controlled Linear Inchworm Actuator for Precise Step and Parallel Motion*", Ritsumelkan University, IEEJ Trans. IA, vol. 126, No. 10, 2006. pp. 1325-1329, with Extended Summary.
Lai, Yen-Jyh, et al., "*Out-of-Plane MEMS Shutter with Continuous Motion Capability for VOA Application*", Asia Pacific Microsystems, Inc. No. 2, R&D Road VI, Science-Based Industrial Park, Hsinchu. Taiwan, Ref. W11-(15)-1, (p. 141).
Last, M., Subramaniam V., K.S.J. Pister, "*Out-of-Plane Motion of Assembled Microstructures Using a Single Mask SOI Process*", Transducers, Seoul, Korea, Jun. 5-9, 2005 (4 pages).
Last, M.E., "*Silicon-on-Insulator Microassembly*", dissertation talk Dec. 2005 (40 pages) <http://www.bsac.eecs.berkeley.edu/~mattlast/papers>>.
Last, Matthew Emanuel, Ph.D. Dissertation entitled "*Pick and Place Silicon on insulator Microassembly*", UC Berkely, Electrical Engineering and Computer Sciences, Fall 2005 (179 pages).
Mani, S.S., Presentation entitled "*NOTES—MEMS: Micro Electro Mechanical System*". Sandia National Laboratories, copyright 2000 (11 pages).
MicroTAS2003 Program from the Transducer Research Foundation, dated Oct. 5, 2003 throught Oct. 9, 2003 in Lake Tahoe, Nevada, (31 pages) <www.transducer-research-foundation.org/microtas2003/program/MicroTAS2003_Program.pdf>.
Milanovic, V., Last, M., Pister, K.S.J., "*Laterally Actuated Torsional Micromirrors for Large Static Deflection*", Photonics Technology Letters, vol. 15, No. 2, Feb. 2003, pp. 245-247.
Milanovic, Velijko, Last, Matthew, Pister, Kristofer S.J., "*Torsional Micromirrors with Lateral Actuators*", Transducers 01, Muenchen, Germany, Jun. 2001 (4 pages).

(56) References Cited

OTHER PUBLICATIONS

Nguyen, H. et al., "*Device Transplant of Optical MEMS for Out of Plane Beam Steering*", Dept. of Electrical Engineering, University of California at Los Angeles, Ref. 0-7803-5996-4/01, 2001, pp. 325-328.

Nnebe, Chukwuney Stabley, Abstract entitled: "*A Mechanically-raised Micromachined Variable Inductor Coil*", Cornell University, May 19, 1999, (1 page).

Okandan, Dr. Murat, "*Track 3—Therapeutic Micro/Nanotechnology*", BioMEMS and Biomedical Nanotechnology World, 2002 (3 pages).

Okandan, M., et al., "*Development of Surface Micromachining Technologies for Microfluidics and BioMEMS*", Sandia National Laboratories, Alburquerque, NM, Proc. SPIE vol. 4560, pp. 133-139, Microfluidics and BioMEMS, Carlos H. Mastrangelo: Holger Becker; Eds., Sep. 2001.

Pister, Prof. Kris, "*Overview of Pistertrans*", Univ. of California, Berkeley, CA, National Workshop on Future Sensing Systems, Lake Tahoe, Granlibakken Conference Center, Aug 26-28, 2002. (7 pages). <www.ca.berkeley.edu/sensors/transcripts/Monday/Pistertrans.pdf>.

Rodgers, M. Steven, et al., "*Designing and Operating Electrostatically Driven Microengines*",Sandia National Laboratories, Albuquerque, NM, SAND-98-0493C. Mar. 9, 1998, (10 pages).

Romig, Jr., Dr. A.D., Presentation entitled "*Mitigating the Chemical, Biological, Radiological and Nuclear (CBRN) Threat*", presented to ASM, International, Albuquerque Chapter, Sandia National Laboratories, Sep. 29, 2004, (30 pages).

Sandia document entitled: "*Introduction and Review of Fabrication Concepts*", copyright 2002 Sandia National Laboratories. (37 pages).

Sandia document entitled: "*MEMS Bibliography—Actuators: SUMMIT V Technology*", copyright 2006 Sandia National Laboratories, (4 pages) <http://mems.sandia.gov/tech-info/mems-bib-actuators.html>.

Sandia document entitled: "*Pac-Man-like microstructure interacts with red blood cells*", News Releases, Sandia National Laboratories, Aug. 15, 2001, internet: <http://www.sandia gov/media/NewsRel/NR2001/gobbler.htm> (4 pages).

Sandia document entitled: "*Sandia's new 'inchworm' actuator studies friction at the microscale, provides detailed information*"from Labnews at Sandia Laboratories, Albuquerque, NM, Feb. 20, 2004, (11 pages).

Sandison, David R., Presentation entitled "*Moving MEMS from Novelty to Necessity—A National Security Perspective*", Sandia National Laboratories, Alburquerque, NM, MEMS Technologies, Jul. 27, 2006 (34 pages).

Sasaki, H. et al., "*A Novel Type of Mechanical Power Transmission Array for Switching Densely-Arrayed Actuator Systems*", Dept of Micro System Eng., Nagoya University, Nagoya, Japan, MEMS 2006, Istanbul, Turkey, Jan. 22-25, 2006. pp. 790-793.

Schurr, Prof. Dr. Marc O., Presentation for the VECTOR consortium entitled "*Microrobotics and allied technologies in medicine: key enablers of prevention and early treatment of diseases*", Novineon Healthcare Technology Partners GmbH, Brussels, Feb. 12, 2007. (30 pages).

Sexton, Fred W., Presentation entitled "*Adhesion & Friction issues in Contacting Microsystems*", Radiation & Reliability Physics Dept., Sandia National Laboratories, Sematech SRC, Oct. 25-27, 2004 (25 pages).

Sriegowski. J.J. et al., "*An Application of Mechanical Leverage to Microactuation*", $8^{th}$ Internaational Conference on Solid State Sensors and Actuators, and Eurosensors IX, Proc. Transducers '95 Eurosensors IS, Stockholm. Sweden, Jun. 25-29, 1995, vol. 2. pp. 364-367.

Stalford, Prof. Harold L., Presentation entitled "*Novel Microblender for Lysing Cells and Other Microfluidic Applications*", School of Aerospace and Mechanical Engineering, University of Oklahoma, $12^{th}$ Intml. Congress of Biorheology (ICB) and the $5^{th}$ Intrnl. Conf. on Clinical Hemorheology (ICCH), May 30-Jun. 3, 2005, Chongquing, China (28 pages).

Tanke, Matt, et all., Microelectronics course overview entitled "*Measuring Cell adhesion Using MEMS Technology*", ME 381, Northwestern University, Fall 2006, taught by Prof. Horacia D. Espinosa (21 pages).

Trease, B.P. et al., "*Design and Analysis of an Out-of-Plane Micro Thermal Actuator*", IMECE2003_41393, International mechanical engineering Congress and Exposition, Nov. 15-21, 2003, Washington, D.C., (3 pages).

Yang, E.H., et al. "*Design and Fabrication of a Large Vertical Travel Silicon Inchworm Microactuator for the Advanced Segmented Silicon Space Telescope*", Jet Propulsion Laboratory, Calif. Inst. of Technology, Pasadena, CA, Proceedings of SPIE—vol. 4981, MEMS Components and Applications for Industry, Automobiles, Aerospace, and Communication II, Siegfried W. Janson, Editor, Jan. 2003, pp. 107-112.

Yeh, Richard, Hollar, Seth, and Pister, Kristofer S. J., "*Single Mask, Large Force, and Large Displacement Electrostatic Linear Inchworm Motors*", Berkeley Sensors and Actuator Center, Dept. of Electrical Engineering and Computer Science, Univ. of California, Berkeley, CA, Journal of Microelectromechanical Systems, vol. 11. No. 4, Aug. 2002, pp. 330-336.

Zickar, Michael et al., "*Quasi-dry Release for Micro Eiectro-Mechanical Systems*", University of Neuchatel, IMT, SAMLAB, Jacquet-Droz 1. 2007 Neuchatel, Switzerland (6 pages).

\* cited by examiner

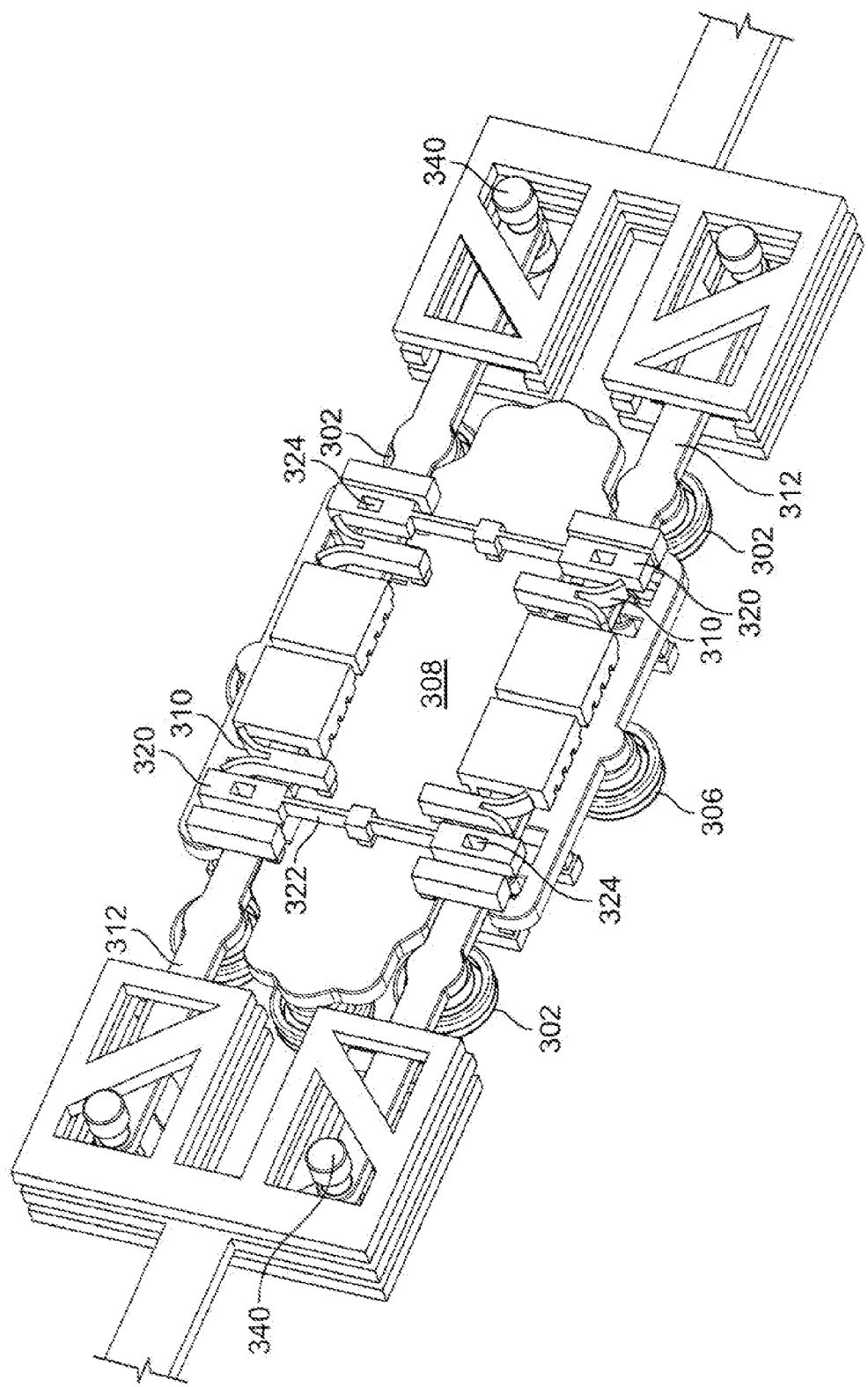

MICRO TRANSPORT MACHINE AND METHODS FOR USING SAME

CLAIM OF PRIORITY

This application claims priority under 35 USC §199(e) to U.S. patent application Ser. No. 60/810,566, filed on Jun. 2, 2006, the entire contents of which are hereby incorporated by reference.

FEDERALLY SPONSORED RESEARCH OR DEVELOPMENT

The U.S. Government may have certain rights in this invention pursuant to Contract No. DE-AC04-94AL85000 awarded by the U.S. Department of Energy.

TECHNICAL FIELD

This invention relates to microelectromechanical systems (MEMS), and more particularly to micro transport machine and methods for using same.

BACKGROUND

MicroElectroMechanical Systems (MEMS) integrate mechanical elements, sensors, actuators, and/or electronics on a common silicon substrate through microfabrication technology. The electronics are often fabricated using integrated circuit (IC) process sequences. The micromechanical components are often fabricated using compatible micromachining processes that selectively etch away parts of the silicon wafer or add new structural layers to form the mechanical and electromechanical devices.

MEMS devices generally range in size from a micrometer (a millionth of a meter) to a millimeter (thousandth of a meter). Common applications include: inkjet printers that use piezo-electrics or bubble ejection to deposit ink on paper, accelerometers in cars for airbag deployment in collisions, gyroscopes in cars to detect yaw and deploy a roll over bar or trigger dynamic stability control, pressure sensors for car tire pressure, disposable blood pressure sensors, displays based on digital light processing (DLP) technology that has on a chip surface several hundred thousand micro mirrors and optical switching technology for data communications.

SUMMARY

Methods and systems for micro machines are provided. In accordance with one aspect of the disclosure, a micro transport machine may include a substrate and a movable device comprising a drive component responsive to a wireless power source. The movable device is operable to move between a plurality of disparate areas on the substrate.

Post assembly and other post fabrication methods may be used to deploy surface micro machined MEMS devices with in-plane shafts and/or out-of-plane hubs, bearings, wheels, disks, gears, and structures of devices of various kinds and the like. For example, out-of-plane bearings may be constructed that hold and contain in-plane (i.e., horizontal) rotating shafts whose cross-sections have the dimensions of the thin film layer thicknesses (e.g., 1 micron).

In accordance with the different aspects of the disclosure, a micro machine may be one to two orders of magnitude smaller than similar devices developed by other technologies. The micro machine may include a micro shaft driven by a micro actuator. A micro transmission may receive in-plane reciprocating motion from the micro actuator and transmit in-plane rotational motion to the micro shaft, receive out-of-plane rotational motion from the micro actuator and transmit in-plane reciprocating motion to the micro shaft, receive out-of-plane rotational motion from the micro actuator and transmit in-plane rotational motion to the micro shaft. For example, the micro transmission can be use in conjunction with existing micro actuators to drive/rotate in-plane shafts or two micro transmissions can be coupled and use in conjunction with existing torsional ratcheting actuators (TRA's) to drive/rotate in-plane shafts. The micro transmissions may allow for advantages to be gained in driving in-plane shafts by various kinds of micro or MEMS actuators. In certain embodiments, advantages of using a micro engine may be lower power requirements and far higher drive frequency rates. In some embodiments, an advantage of using a thermal actuator is that it may provide 100 to 1000 times more force than that of the micro engine. Another advantage may be that its footprint on chip is more than ten (10) times less than that of the micro engine. In some other embodiments, an advantage of using a TRA actuator is that it can turn the horizontal shafts incrementally "degree-by-degree" via its ratcheting mechanism.

The shaft may be horizontal and sized in or less than the micrometer domain. A micro bearing may support rotation of the micro shaft. The micro bearing may include multiple components each be rotatable from a first orientation in-plane with the substrate to a second orientation out-of-plane with the substrate to engage the shaft. A tool may be coupled to the micro shaft and perform work in response to motion of the micro shaft. In the micro machine, or device, micro structures may be moved into engagement with other micro structure in response to inputs.

The micro machine may be a micro rotary machine such as a micro blender including a tool with a plurality of teeth or a micro transport machine including a plurality of micro wheels rotatable about a micro axle. For example, a micro blender may comprise a MEMS device with a 2.25 micron square shaft for lysing cells mechanically to remove subcellular elements (e.g., genetic material). The micro blender may have one (1) micron size cutters on its end, extending into a micro fluidic channel, for lysing cells, for cutting-up various kinds of objects, or for shaving-off material in the making of products such as pharmaceutical drugs. As another example, a micro vehicle may comprise a MEMS micro vehicle with wheels the size of red blood cells for performing robotic multitasking functions on chip. Other suitable micro machines may be constructed.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 3A-E illustrate a micro vehicle machine in accordance with one embodiment of the disclosure;

Like reference symbols in the various drawings indicate like elements.

DETAILED DESCRIPTION

Figure 1:
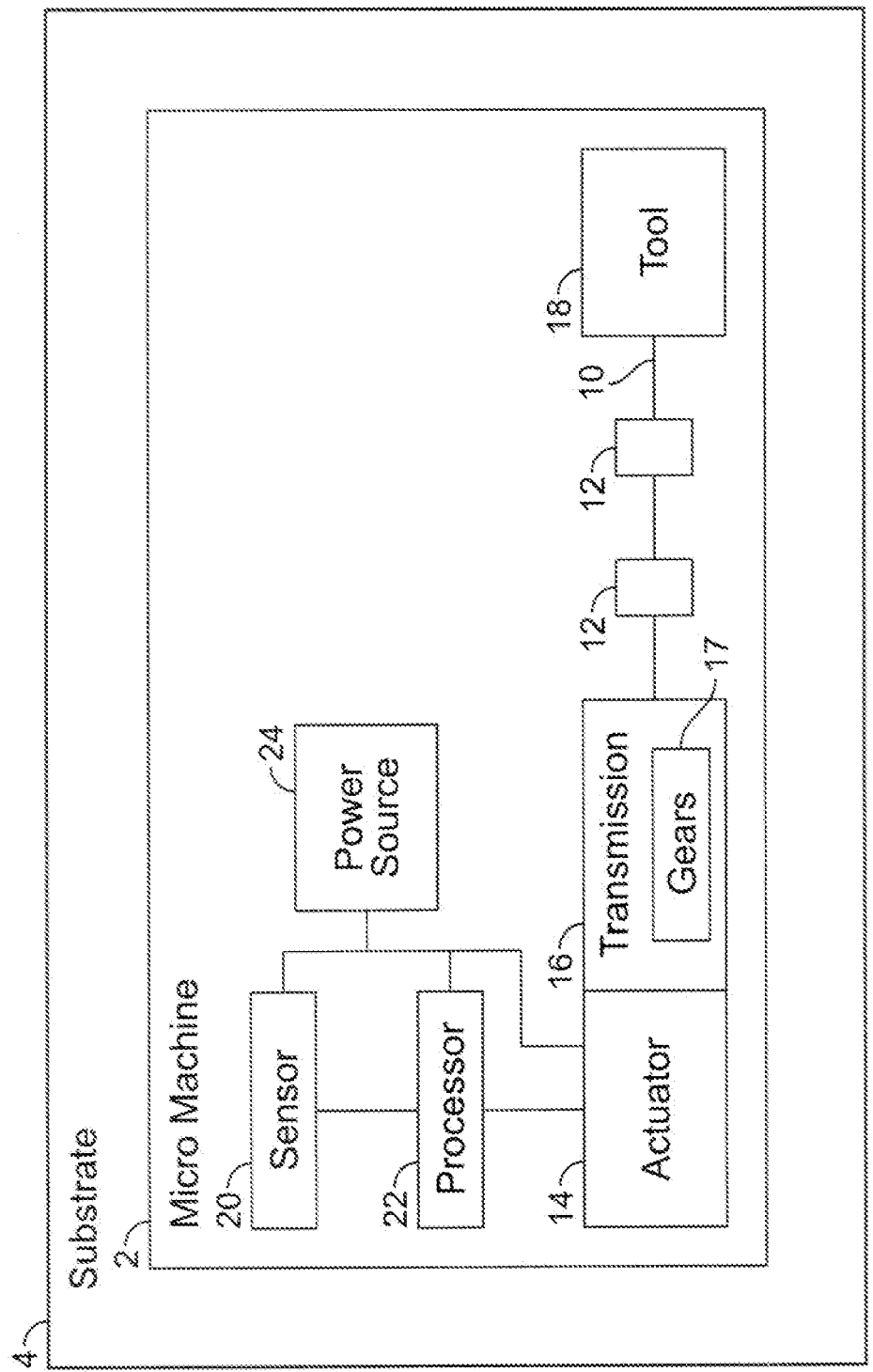
FIG. 1 illustrates a micro machine in accordance with one embodiment of the disclosure.

FIG. 1 illustrates one embodiment of a micro machine 2. The micro machine 2 is a miniaturized complex system or device with a diverse set of electrical and/or mechanical functions integrated into a small package, such as a chip. The chip may be, for example, a flip-chip or other suitable chip. The micro machine 2 may transmit, transform and/or modify energy to perform or assist in performing a task. Example micro machines 2 include micro lyser, micro blenders, micro mixers, micro grinders, micro vehicles, micro generators, micro motors, micro needles, micro drills, and micro transporters.

The micro machine 2 may be sized in the millimeter, micrometer (micron), submicron (for example nanometer) or other suitable domain. In the micro machine 2, one or more components and/or features of components are sized in the micron or submicron domain. Such features may comprise the length, diameter or other suitable dimension of a component. The micro machine 2 may comprise a Micro Electro-Mechanical System (MEMS), also know as a MicroSystem. In a particular embodiment, the MEMS micro machine 2 may have features 1-100 microns in size. In other embodiments, a micro machine 2 may be sized in the centimeter domain, particularly in length. The micro machine may be a 3D MEMS machine with elements extending above fabricated position or moved out of plane.

Referring to FIG. 1, the micro machine 2 includes fixed and movable structures or elements fabricated as part of an integrated circuit (IC) or otherwise on a substrate 4. In the illustrated embodiment, the micro machine 2 includes a micro shaft 10, one or more micro beatings 12 for the shaft 10, a micro actuator 14 for driving the shaft 10 (or other part of the micro machine 2), a micro transmission 16 coupling the actuator 14 to the shaft 10 and a micro tool 18 driven by the shaft 10 for performing work. The micro shaft 10 with the micro bearings 12 may form a micro drive assembly.

The micro machine 2 may also include a micro sensor 20 to gather information from the environment. A micro processor 22 may process the information derived from the sensor 20 and control operation of the micro machine 2 as well as receive and transmit command, control, and data communications. Miniaturized power systems 24 can be mated to sensors 20, actuators 14, and micro processor 22.

In some embodiments, the micro machine 2 may include fewer, additional, or different components and may include even multiple micro shafts 10. For example, one or more of the shaft 10, bearings 12, actuator 14, transmission 16, sensor 20, or processor 22 may be omitted. The micro machine 2 may be fixed to the substrate 4, movable on the substrate 4 and/or separable from the substrate 4. In addition, one or more of the components may be fabricated or reside on a separate substrate or be omitted.

The shaft 10 is an elongated bar, other element or set of elements that may, for example, rotate, otherwise move or transmit power. The shaft 10 may be a horizontal shaft patterned or otherwise fabricated in-plane with the substrate 4. In one embodiment, the shaft 10 may have a square cross section and may, for example, be one, two, or more microns in size. In other embodiments, the shaft 10 may, for example, have a round or rounded cross section and/or be of a submicron size. Also, the shaft 10 may, for example, be 100s of microns in length. For an integrated circuit embodiment, the shaft 10 may be formed from a thin film of conductor, semiconductor or dielectric material. For example, the shaft 10 may comprise polysilicon, nitride, oxide, and/or a metal such as copper, titanium, and the like.

The bearings 12 support, guide and/or reduce friction of motion for a moving part. The bearings 12 may support the shaft 10 for repeated relative movement between the shaft 10 and the bearings 12. As described in more detail below, the bearings 12 may each comprise an aperture opening sized to receive the shaft 10 and to allow rotation or other relative movement of the shaft 10 therein. The aperture may be round, rounded or otherwise suitable shaped and may have tight tolerance with the shaft 10. As also described in more detail below, each bearing 12 may comprise an upper half and a lower half patterned in-plane with the substrate 4. In this embodiment, the bearing 12 may be assembled post fabrication by rotating or otherwise moving the upper and lower halves out-of-plane for engagement with the shaft 10 as a bearing.

The actuator 14 imparts or generates motion. For example, the actuator 14 may be a motor and/or may convert electrical energy into mechanical energy. The actuator 14 may drive the shaft 10 directly or through the transmission 16. In these embodiments, the actuator 14 rotates, reciprocates or otherwise moves the shaft 10. In other embodiments, the actuator 14 may drive another part of the micro machine 2 or be omitted. The actuator 14 may, for example, be a thermal actuator, an electrostatic actuator, piezoelectric actuator, shape-memory alloy actuator, pneumatic actuator, micro engine, or torsional ratchet actuator (TRA). The actuator 14 may be electrically, mechanically, chemically, or otherwise powered.

The transmission 16 transmits power between components. For example, the transmission 16 may be an assembly of gears and associated parts by which power is transmitted from an actuator to a drive shaft. The transmission 16 may couple or otherwise directly or indirectly connect the actuator 14 to the shaft 10. In one embodiment, the transmission 16 converts or otherwise transforms one type of motion into another type of motion. For example, as described in more detail below, the transmission 16 may transform reciprocating motion from the actuator 14 into rotational motion for the shaft 10. In another embodiment, the transmission 16 may transform out-of-plane rotation from the actuator 15 into in-plane rotation. In still other embodiments, the transmission 16 may transform an initial type of motion to one or more intermediate types of motion and the intermediate type of motion to a final type of motion output for rotating the shaft 10.

The tool 18 is a device capable of performing mechanical work or other task. As described in more detail below, the tool 18 may, for example, comprise one or more wheels, cutters, files, blades, lysers, gears, needles, separators, dividers, and transporters. The tool 18 may be rotated, reciprocated or otherwise moved to perform work. In other embodiments, the tool 18 may be fixed in place.

The sensor 20 detects and responds to a signal or stimulus. For example, the sensor 20 may gather information from a component or operation of the micro machine 2 through measuring mechanical, thermal, biological, chemical, optical or magnetic phenomena. Exemplary sensors 20 may include micro inductors, micro circuits, micro filters/resonators, micro radio frequency devices (RF), micro-chem labs, surface acoustic wave (SAW) filters, SAW resonators, SAW devices, micro-pumps, micro-fluidics devices, nano-sensors for detecting physical, chemical, or biomedical signals, piezo-resistors, resistors, piezoelectric devices, magnetic materials and components, micro heaters, nano pumps, nano devices, nano materials, micro-mirrors, Micro OptoElectro Mechanical Systems (MOEMS) components, photonic lattices and components, quantum dots, and the like.

The processor 22 may be any suitable electronics or devices that processes information derived from the sensor 20 and through decision making capability controls the micro machine 2 (including one or more components therein). For example, the processor 22 may direct the actuator 14 or other component to respond by moving, positioning, regulating, pumping, and/or filtering, thereby controlling the environment to achieve the desired outcome or purpose.

Miniaturized power system 24 may comprise any suitable on-chip source. Also or instead, as described below, off-chip sources may be used. On-chip and off-chip sources may comprise, for example, a micro battery or other micro fuel cell, a micro combustion engine, a solar cell that collects and/or converts light energy to electrical energy, a cell that collects and/or converts acoustic energy such as ultra sound to electrical energy, a chemical or biological cell of energy that converts its energy to any form of electrical or mechanical energy. In addition, the power source, or supply, may comprise a micro scale energy-scavenging device that draws energy from the environment such as vibrational energy or wind energy. The energy-scavenging device may also draw power from temperature gradients, human power, pressure gradients and the like.

In operation, the micro machine 2 may transmit, transform and/or modify energy to perform or assist in performing any suitable task at the micro, nano, sub nano, or other suitable level. Also, the micro machine 2 may include, as described in more detail below, systems, during operation or power-up, to rotate, deploy, transform, position, cycle, or otherwise move structures and elements on-chip and/or into engagement with the other structure and elements either on-chip or off-chip. Engagement may occur when an element is operatively or otherwise suitable associated with another. For example, when correctly positioned within specified tolerances to support relative movement, communication or signal transfer.

The micro machine 2 and components of the micro machine 2 may be fabricated using any suitable processes and materials. For example, the micro machine 2 may be fabricated in ceramics, metals, polymers and/or silicon using surface micromachining electroplating and/or molding processes. Surface micromachining comprises using thin films and patterning via photolithography on a substrate (directly on the substrate or on structures on the substrate). Structures may be fabricated through alternate deposition and patterning of sacrificial and structural materials and connecting anchors between various layers. Specific exemplary processes include Sandia Ultra-planar Multi-level MEMS Technology (SUMMiT V™) and Lithographic Galvanoformung und Abformung (LIGA). The SUMMiT process may comprise SUM-MiT V™, a five layer polycrystalline surface micromachining fabrication process. In this process, film layer thickness may comprise, for example, 1, 2.25 and 2.5 microns with greater thicknesses (e.g. 4 and 6 microns) obtained by dimple cuts and/or sandwiching layers together using anchors.

Specific surface micromachining processes that may be used include deposition, photolithography, etching, reactive ion etching (RIE), deep RIE (DRIE), and bulk micro machining. The deposition process deposits thin films of material. The film may have a thickness anywhere between a few nanometers to about 100 micrometer. Commonly used deposition processes include electroplating, sputtering, physical vapor deposition (PVD) and chemical vapor deposition (CVD).

Lithography transfers a pattern to a photosensitive material by selective exposure to a radiation source such as light. A photosensitive material changes in its physical properties when exposed to a radiation source. The exposed region can then be removed or treated providing a mask for the underlying substrate. Photolithography is often used with metal deposition, wet and dry etching.

Etching processes include wet etching and dry etching. In wet etching, the material is dissolved when immersed in a chemical solution. In dry etching, the material is sputtered or dissolved using reactive ions or a vapor phase etchant. Metals may be used as masks for dry and wet etching other materials depending on the selectivity of the metal to the etchant.

In reactive ion etching (RIE), the substrate 4 is placed inside a reactor in which several gases are introduced. Plasma is struck in the gas mixture using an RF power source, breaking the gas molecules into ions. The ions are accelerated towards, and reacts at, the surface of the material being etched, forming another gaseous material. This is the chemical part of reactive ion etching. There is also a physical part which is similar to the sputtering deposition process. If the ions have high enough energy, they can knock atoms out of the material to be etched without a chemical reaction. The balance between chemical and physical etching may be changed to influence the anisotropy of the etching, since the chemical part is isotropic and the physical part highly anisotropic the combination can form sidewalls that have shapes from rounded to vertical.

In the DRIE process, etch depths of hundreds of micrometers can be achieved with almost vertical sidewalls. The primary technology is based on the Bosch process where two different gas compositions are alternated in the reactor. The first gas composition creates a polymer on the surface of the substrate, and the second gas composition etches the substrate. The polymer is immediately or otherwise sputtered away by the physical part of the etching, but only on the horizontal surfaces and not the sidewalls. Since the polymer only dissolves very slowly in the chemical part of the etching, it builds up on the sidewalls and protects them from etching. As a result, etching aspect ratios of 50 to 1 can be achieved. The process can be used to etch completely through a silicon substrate, and etch rates are 3-4 times higher than wet etching.

Bulk micromachining is similar to deep etching but uses a different process to remove silicon. Bulk micromachining uses alkaline liquid or other suitable solvents, such as potassium hydroxide, to dissolve silicon which has been left exposed by the photolithography masking step. The alkali solvents dissolve the silicon in a highly anisotropic way, with some crystallographic orientations dissolving up to 1000 times faster than others. Such an approach may be used with very specific crystallographic orientations in the raw silicon to produce v-shaped grooves. The surface of these grooves can be atomically smooth if the etch is carried out correctly with dimensions and angles being extremely accurate.

Figure 4A:
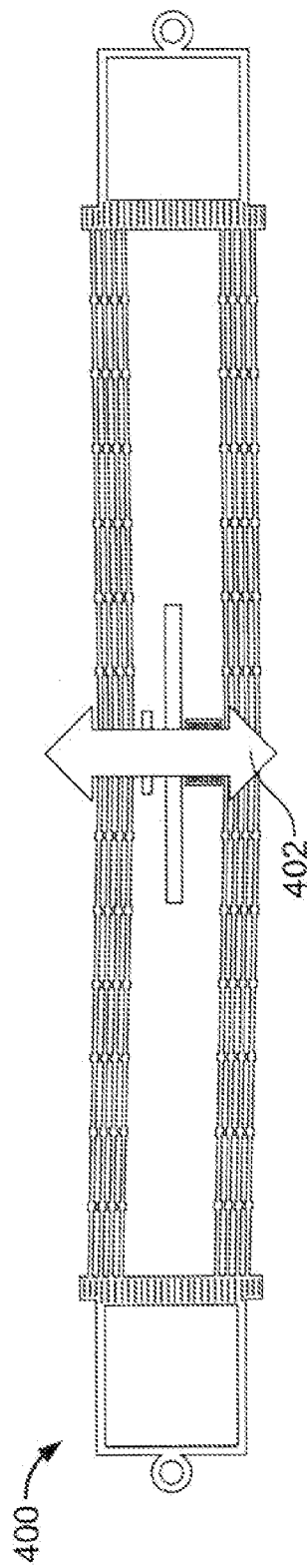
FIGS. 4A-D illustrate micro activators for a micro machine in accordance with several embodiments of the disclosure.
Figure 4B:
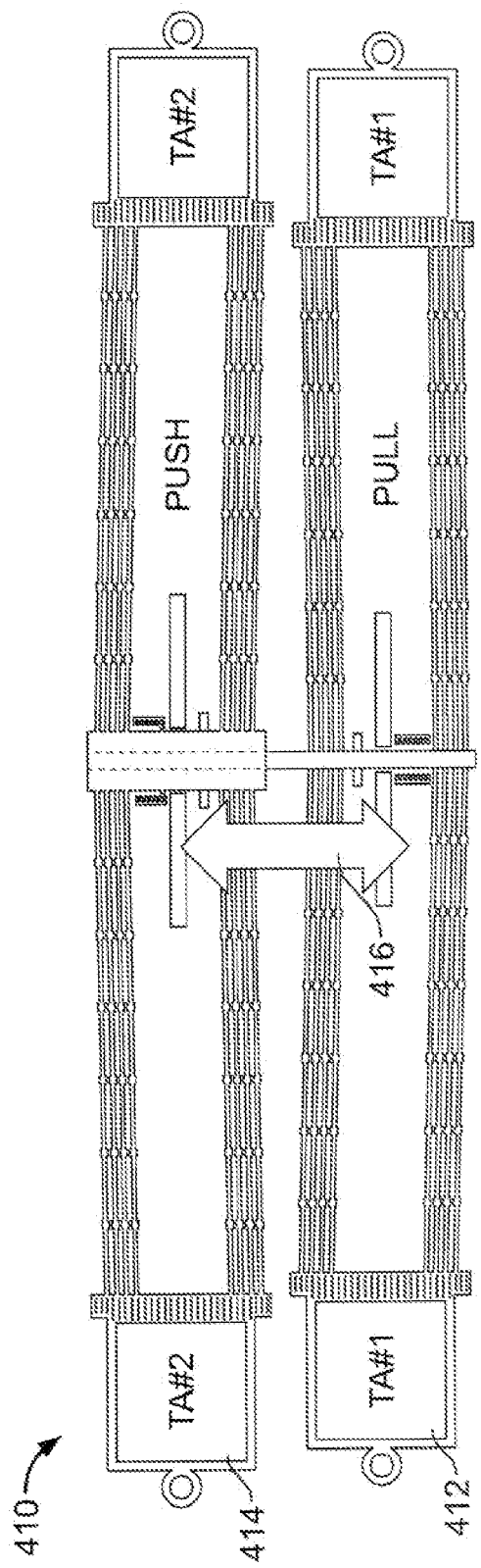
Figure 4C:
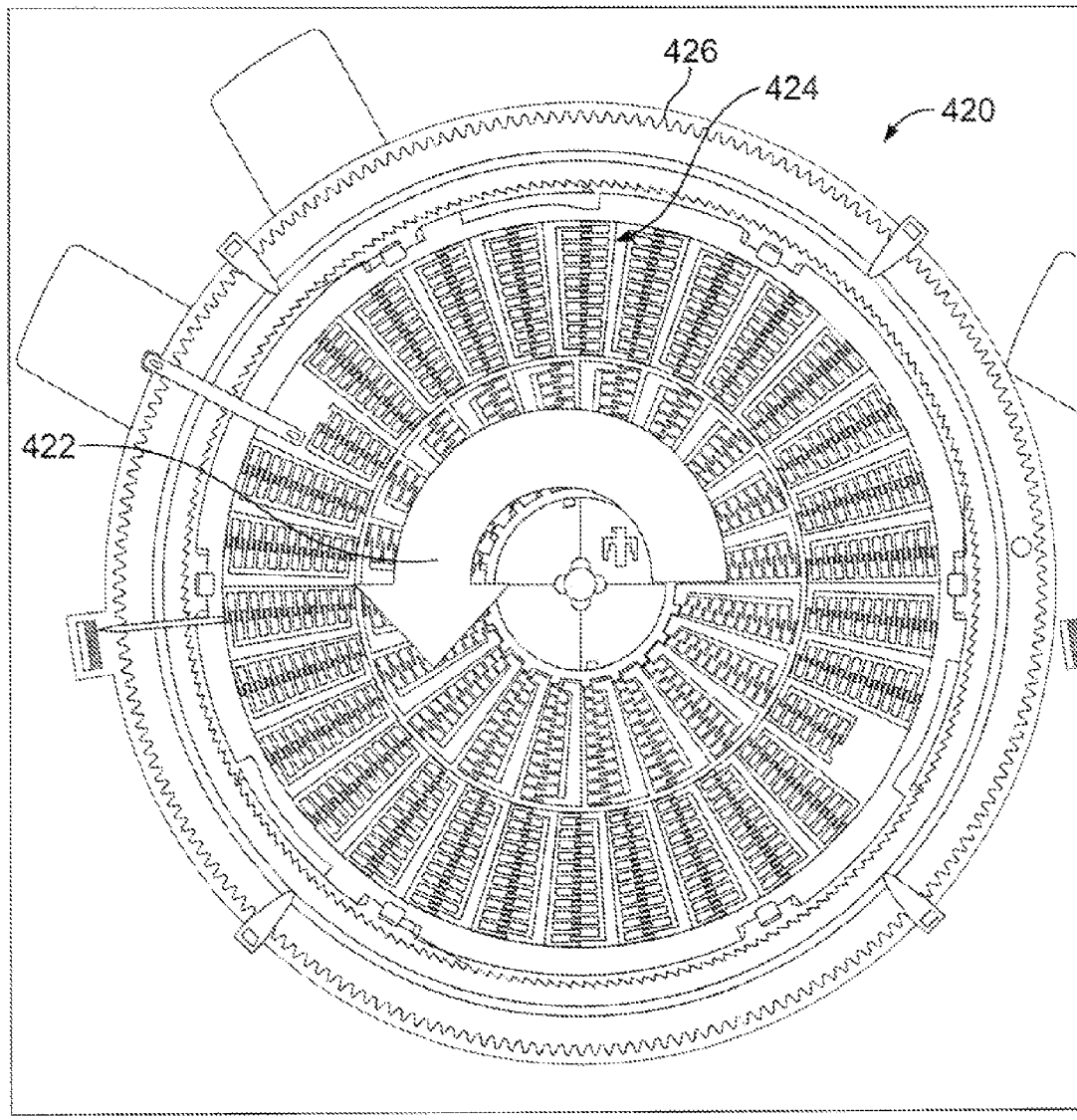
Figure 4D:
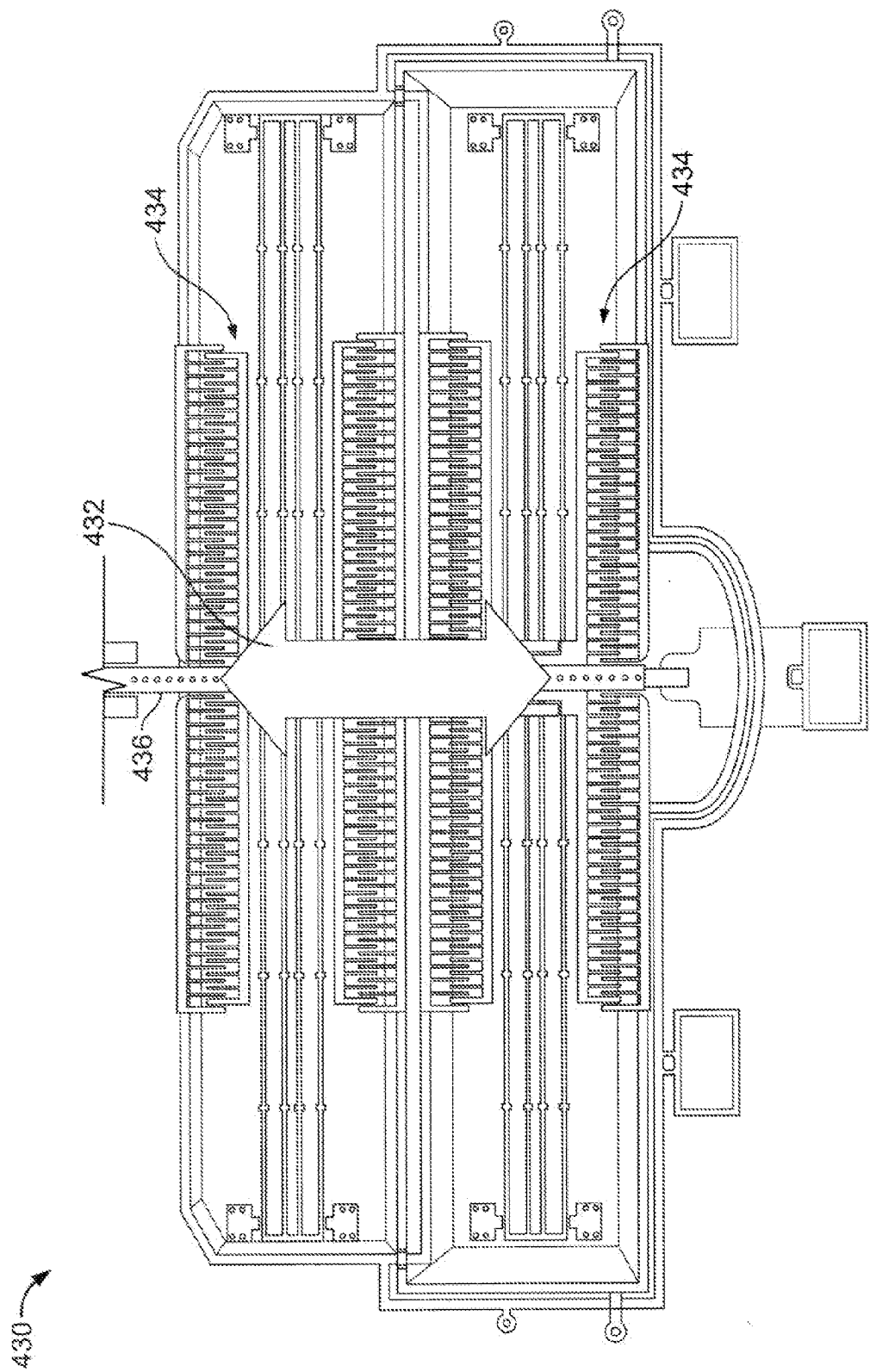
Figure 5A:
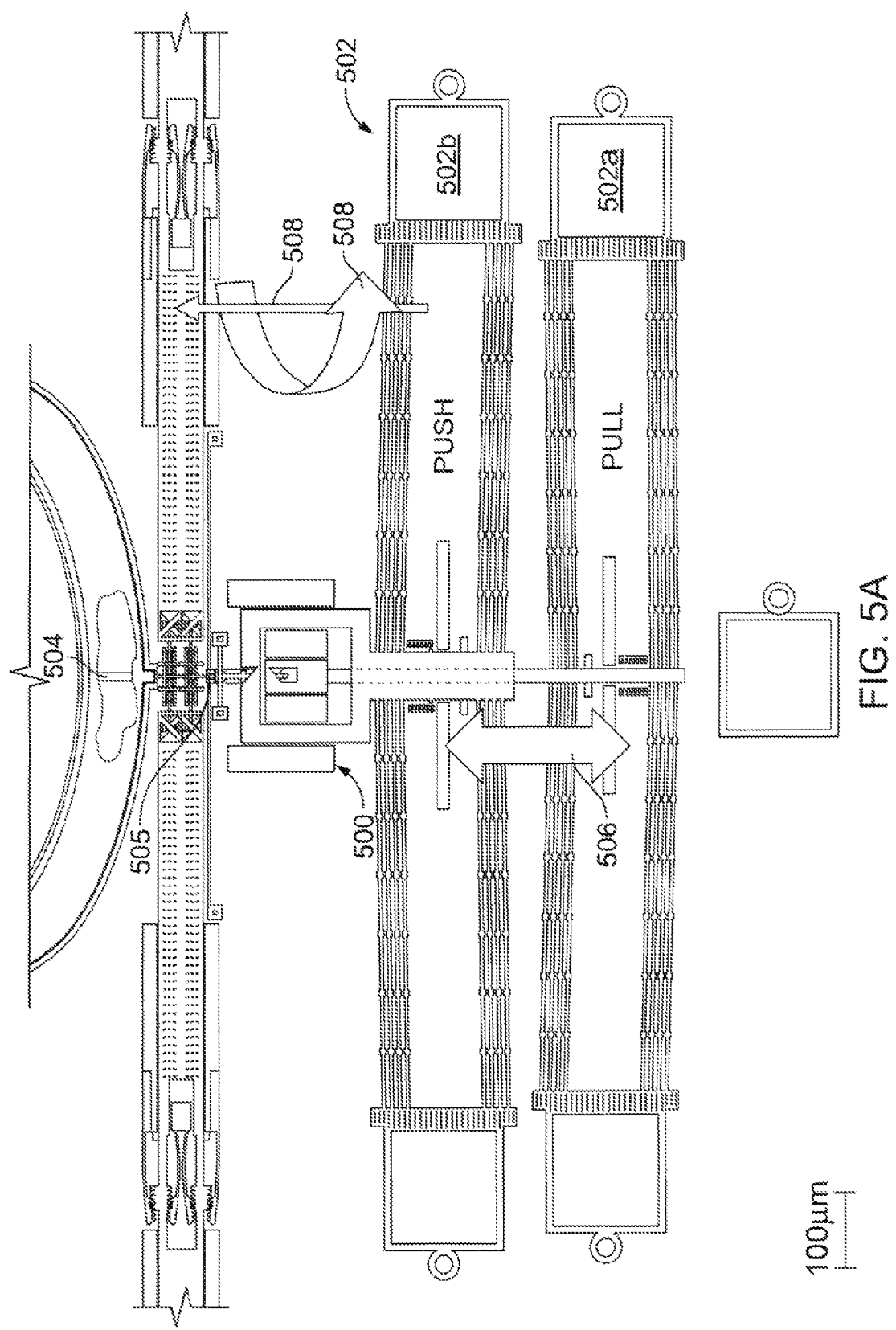
FIGS. 5A-E illustrate micro transmissions for a micro machine in accordance with several embodiments of the disclosure.
Figure 5B:
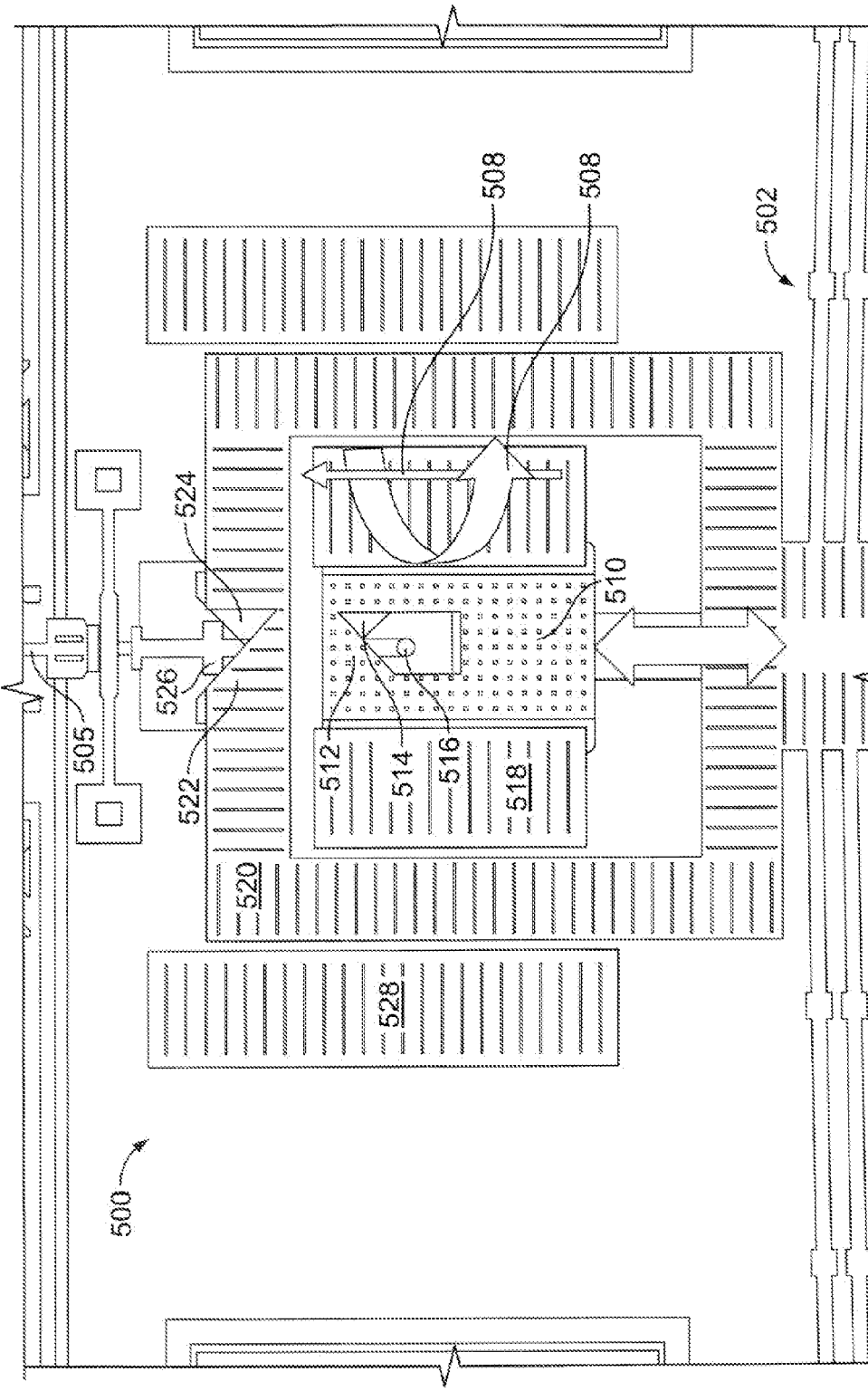
Figure 5C:
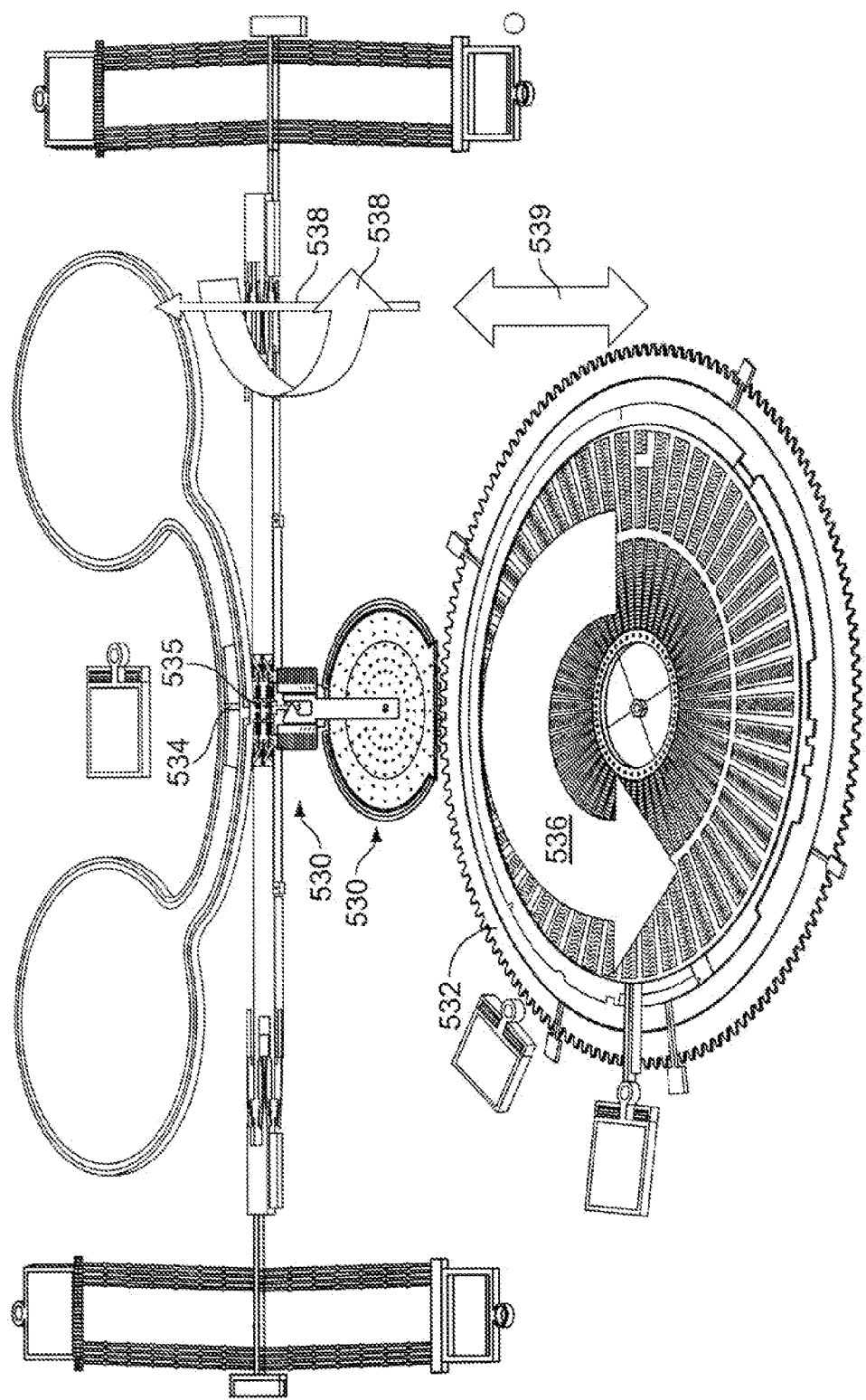
Figure 5D:
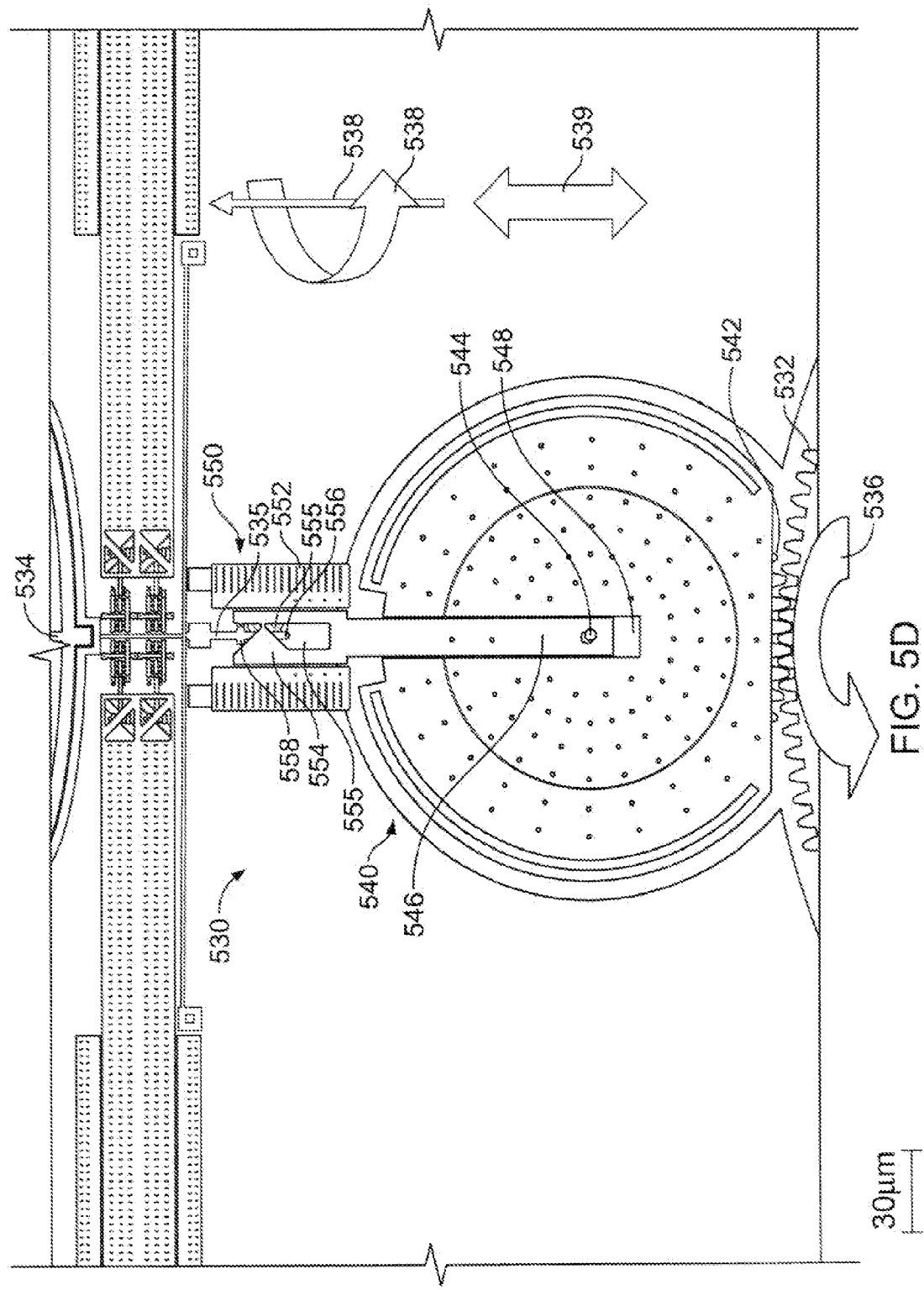
Figure 5E:
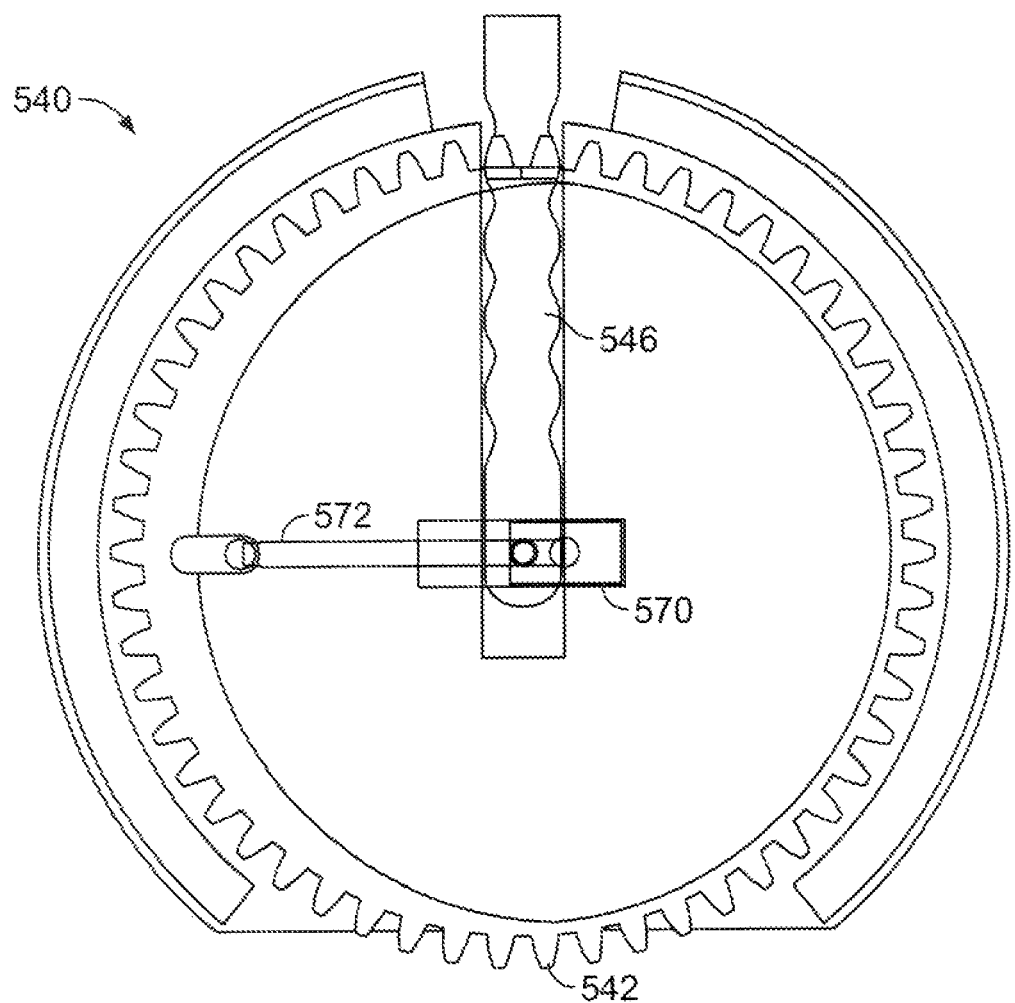
Figure 6:
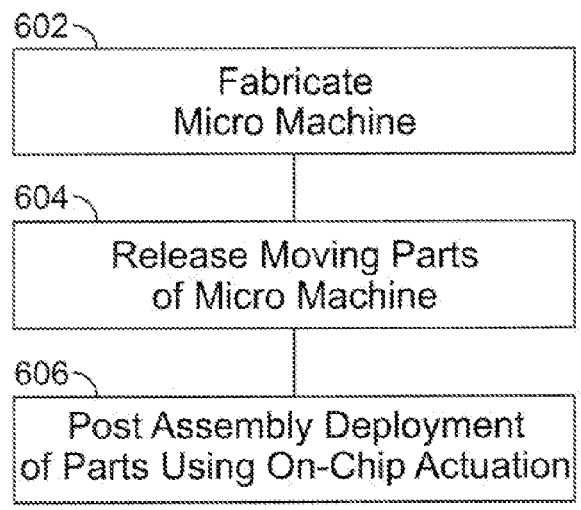
FIG. 6 illustrates a method of manufacturing a micro machine in accordance with one embodiment of the disclosure.

FIGS. 2-10 illustrate specific embodiments of the micro machine 2 and components of micro machine 2. In particular, FIGS. 2A-H illustrate one embodiment of micro rotary machine, a micro blender 200. FIGS. 3A-E illustrate one embodiment of a micro transport machine, a micro vehicle 300. FIGS. 4A-D illustrate several embodiments of micro actuator 14. FIGS. 5A-E illustrate several embodiments of micro transmission 16. FIG. 6 illustrates one embodiment of a method for manufacturing a micro machine 2. FIGS. 7-10 illustrate other aspects and embodiments of the disclosure. The described micro machines 2 and methods are illustrative and any other suitable type of micro machine 2 may be made and used without departing from the scope of this disclosure. In each of FIGS. 2-10, where bond pads are illustrated, the bond pads may each be about 100 microns square, and the rest of the elements in the same and related figures may be to scale with the bond pad. The bond pads may be used to power, charge or discharge elements or otherwise.

FIGS. 2A-H illustrate one embodiment of a micro rotary machine. A micro rotary machine comprises a rotating drive, such as a shaft, for performing work. In the illustrated embodiment, the micro rotary machine is a micro blender 200. The micro blender 200 may be used for lysing cells, removing subcellular elements (e.g. genetic material), mixing at micron levels or below, cutting-up various kinds of objects, shaving-off material in the making of products such as pharmaceutical drugs and for any suitable micro fluidic or other micro application. Thus, for example, the micro blender 200 can be used to cut up the same kind of objects or it could be used to cut up many different objects and mix the parts.

In the illustrated embodiment, the micro blender 200, components of the micro blender 200 and features of the components are shown at or proximate to scale. It will be understood that the size of the components may be varied without departing from the scope of the disclosure. In addition, the micro blender 200 may be otherwise constructed with additional, fewer or other components. For example, embodiments of the micro blender using different transmissions are illustrated in FIGS. 5A-E.

Figure 2A:
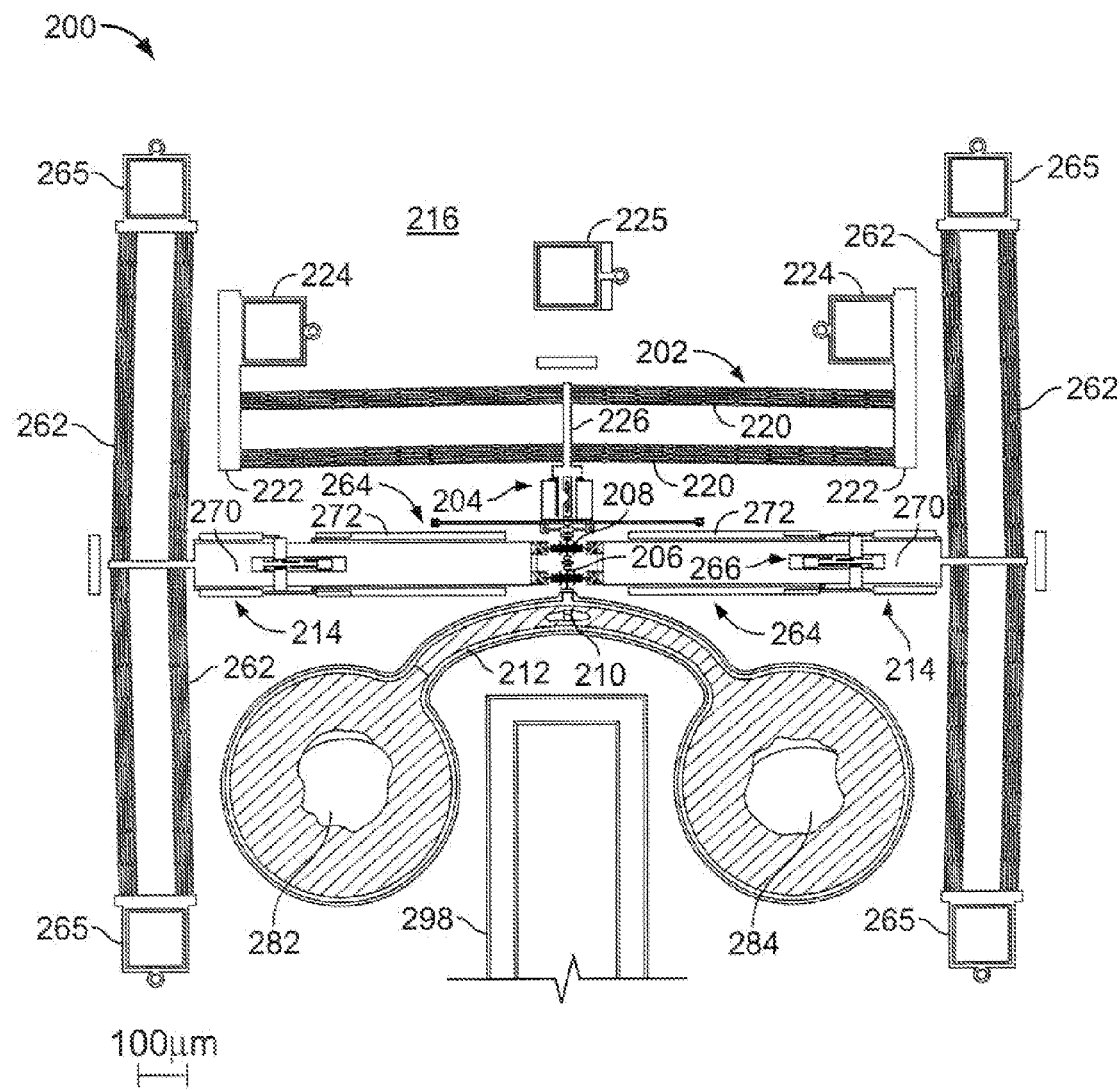
FIGS. 2A-H illustrate a micro blender machine in accordance with one embodiment of the disclosure.

Referring to FIG. 2A, the micro blender 200 includes a micro actuator 202, a micro transmission 204, a micro shaft 206, micro bearing assemblies 208, a micro tool 210 and a micro fluidic channel 212 fabricated on a substrate 216. The actuator 202 drives shaft 206 via the transmission 204. The bearings of micro bearing assemblies 208 support rotation of the shaft 206, which drives the tool 210 in the fluidic channel 212, which may be covered. A bearing deployment system 214 is provided to deploy the bearings 206. The micro blender 200 may include fewer, additional, or different components. In addition, one or more of the components may be fabricated or reside on a separate substrate.

The actuator 202 may comprise a thermal actuator with expansion members 220 extended in a slight V-configuration or arc between conductive stops 222. In some embodiments, the actuator 202 may comprise double or other tandem thermal actuators described in more detail in connection with FIG. 4A. In this embodiment, a transmission such as illustrated in FIG. 5A may be used in place of illustrated micro transmission 204.

A transmission shuttle 226 is connected between the expansion members 220 at their center. Thermal actuators could have multiple shuttles to drive multiple transmissions. In a specific embodiment, the expansion members 220 each comprise a series of elongated bars periodically interconnected by posts. For example, the bars may be arranged in a matrix of four vertical columns and three horizontal rows of bars (three levels with each level being four bars wide). The bars may be vertically interconnected by anchors to form the posts. Details of a post is illustrated in FIG. 2E.

The conductive stops 222 are connected to bond pads 224 or other ports. In response to an input such as a voltage potential placed across the bond pads 224 via a probe, circuit lead, circuit lead of circuit lead frame, or other device current flows across and heats up the expansion members 220. The heat causes the expansion members 220 to thermally expand and buckle at the transmission shuttle 226 in the direction of the configured V due to their confinement by the conductive stops 222. The transmission shuttle 226 is driven by the buckling of expansion members 220.

In operation, the transmission shuttle 226 is driven in reciprocating motion with the buckling and unbuckling of the V-shaped expansion members 220. In a specific embodiment, the voltage potential may be eight volts at or less than 20 milliamps. In this embodiment, the thermal actuator 202 may operate at one kilohertz (KHz), which produces a shaft rotation of 500 revolutions per minute (RPM's). Other suitable voltages and/or rotational speeds may be used. Also, in a specific embodiment, the reciprocating motion may be twelve (12) microns in length. An additional bond pad 225 may be provided for discharging the substrate 216.

Figure 2B:
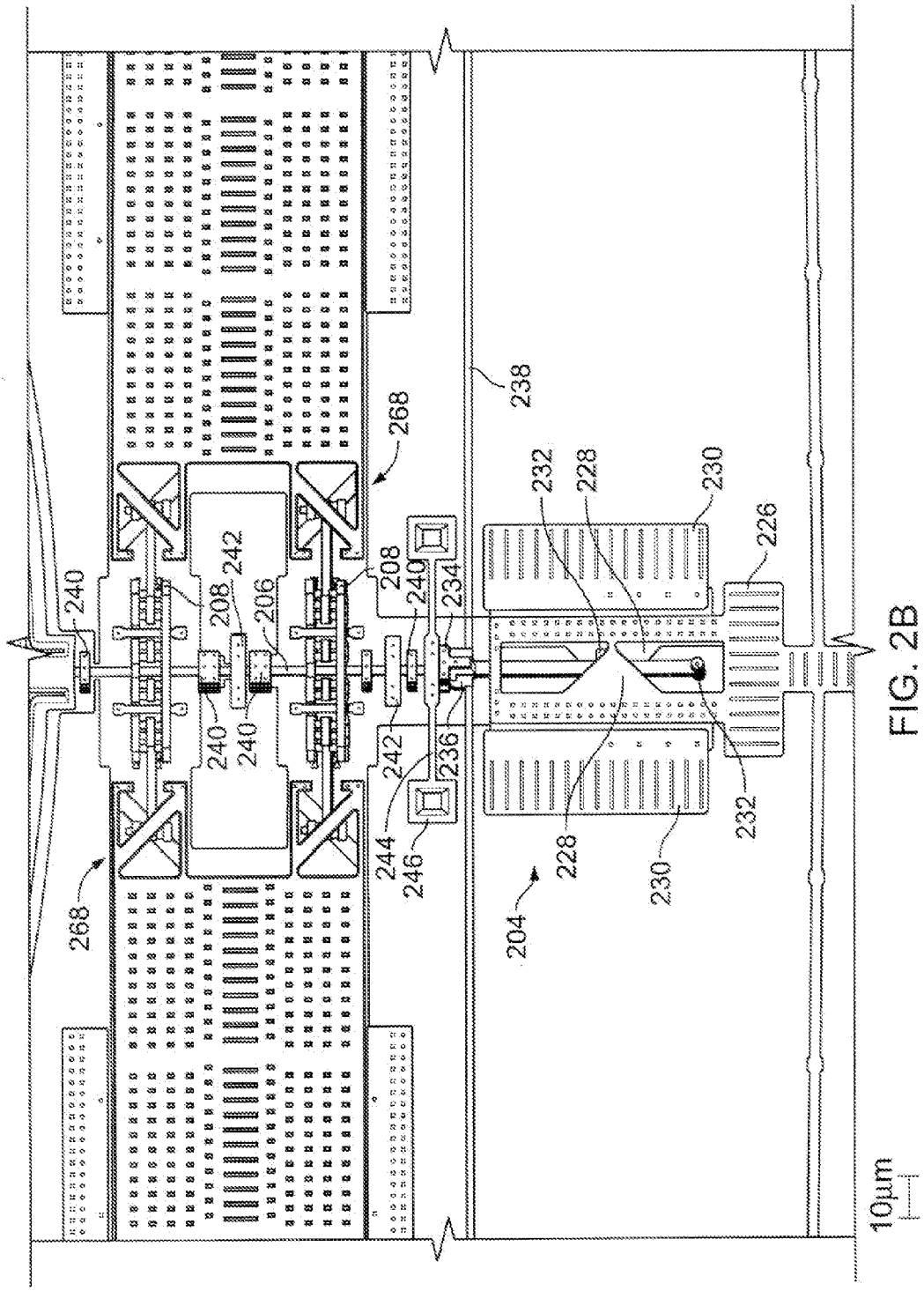

Referring to FIG. 2B, the transmission 204 includes the transmission shuttle 226 (which extends from the thermal actuator 202) disposed between guides 230. A counter rotational stop 234 may also be provided. The transmission shuttle 226 includes upper and lower wedges 228 disposed above and below a drive end of the shaft 206. The drive end of the shaft 206 includes offset cranking columns 232. In the illustrated embodiment, the cranking columns 232 are offset ninety (90) degrees. Accordingly, at least one cranking column 232 is in a vertical orientation for each movement of the transmission shuttle 226. Dimples are used in the shuttle to reduce friction as it moves back and forth and to limit its vertical movement to nanometers tolerance.

In operation, the upper and lower wedges 228 move with the rest of the transmission shuttle 226 in reciprocating motion (laterally back and forth) between the guides 230. During forward movement of the transmission shuttle 226 in a first direction, the upper and lower wedges 228 engage the then vertically oriented cranking column 232 and turn it 90 degrees from a vertical orientation to a horizontal orientation. More specifically, the upper and lower wedges 228 push distal ends of vertically oriented cranking column 232 in opposite directions to rotate the cranking column 232 and thus the shaft 90 degrees. As the shaft 206 rotates, the offset cranking column 232 that was horizontal is turned vertical. During backward movement of the transmission shuttle 226 in a second opposite direction, the upper and lower wedges 228 engage the then veritcally oriented cranking column 232 and turn it an additional 90 degrees from the vertical orientation to the horizontal orientation. As the shaft 206 rotates, the offset cranking column 232 that was horizontal is turned back to vertical. In this embodiment, one reciprocating back and forth cycle of the transmission shuttle 226 (i.e., one reciprocating cycle of the upper and lower wedges 228) causes the shaft 206 to rotate 180 degrees. Two cycles produces one cycle of rotation of the shaft 206.

The drive end of the shaft 206 may include additional cranking columns 232 and/or a different offset between cranking columns 232. Also, the transmission shuttle 226 may include additional upper and lower wedges 228. Thus, for example, the shaft 206 may be rotated 180 degrees by a back-and-forth movement of the transmission shuttle 226 a full revolution. The transmission shuttle 226 can be driven, for example, by double thermal actuators connected rigidly together and configured with their "V-like" structures positioned in opposite directions as well as driven by Sandia's SymmDrive Microengine. When the double thermal actuators are connected rigidly together in this configuration, the two electric pulses that are sent to them are offset in a slight time delay to allow for their buckling to act in the same direction. The first thermal actuator receiving the first electric pulse determines the direction of motion; the other thermal actuator receiving the delayed pulse will then follow and push in the same direction as the first. The reciprocating back-and-forth motion is obtained by reversing which actuator gets the first electric pulse and which gets the delayed pulse. The delayed pulse only need to be long enough for the "V-like" structure on the second thermal actuator to reverse from one side to the other side. Since both thermal actuators are acting together in the same direction, the amount of force achieved by this configuration is double what is achievable by either of the single thermal actuators in other configurations where they are not rigidly connected together. Further, the upper and lower wedges 228 may be otherwise configured such that for example, reciprocation of the transmission shuttle 226 causes the shaft 206 to rotate back and forth 90 degrees rather than to fully rotate.

The transmission 204 may include gears to alter rotational speed of the shaft 206 relative to reciprocal motion of the thermal actuator 202. The gear ratio may be set to speed up or slow down shaft rotation and may be fixed or dynamically adjustable in response to sensor input and processor control. For example, light shear-torque loads (e.g., mixing gasses) may allow for a high gear ratio while heavy shear/torque loads (e.g., mixing solids or viscous fluids, lysing cells or biomaterials) may require a low gear ratio or multiple sets of wedges 228 and cranking columns 232.

The counter rotational stop 234 reduces or prevents rotation of the shaft 206 in a direction opposite the drive direction. For example, a heavy and/or compressible load at the tool 210 may cause the shaft 206 to torque and/or to spring back in a counter rotational direction. The counter rotational stop 234 reduces or prevents backward rotation such that the next reciprocating cycle of the transmission shuttle 226 will rotate the shaft 206 a next 90 degrees in the drive direction.

In one embodiment, the counter rotational stop 234 comprises a set of four counter rotational tabs 236 fixed to the shaft 206. The counter rotational tabs 236 are each offset by 90 degrees and extend from an in alignment with the longitudinal axis of the shaft 206 to form a plus sign (+) cross section. Horizontal poles 238 are elongated and engage the counter rotational tabs 236 from each side of the shaft 206 to prevent counter rotation. More specifically, the horizontal poles 238 are vertically but not horizontally displaceable. Thus, each horizontal pole 238 allows a then horizontal counter rotational tab 236 to temporally and vertically displace the horizontal pole 238 (up or down as the case may be) as the shaft 206 rotates in the drive direction. Counter rotational tabs 236 moving counter rotationally from vertical to horizontal will impact ends the horizontal poles 238 and thus be stopped to prevent counter rotation of the shaft 206. Other suitable counter rotational stops 234 may be used. In additional, the counter rotational stop 234 may be omitted.

The shaft 206 may be a unitary, continuous and/or comprise a plurality of parts. In the illustrated embodiment, the shaft 206 is unitary and continuous, extending from the transmission 205 to the tool 210. In a particular embodiment, the shaft 206 may be 100s of microns in length and may be a 2.25 micron square shaft. Along its length, the shaft 206 may include a plurality of position tabs 240. The position tabs 240 extend from and perpendicular to the longitudinal axis of the shaft 206. The position tabs 240 abut and/or face opposing position stops 242. The position stops 242 may be rigid or flexible. A rigid position stop 242 may be fixed to and extend directly from the substrate 216. A flexible position stop 242 may be indirectly coupled to the substrate via elongated poles 244 and post 246. The shaft 206 may be otherwise suitable constructed and/or, if needed, maintained in position.

Figure 2C:
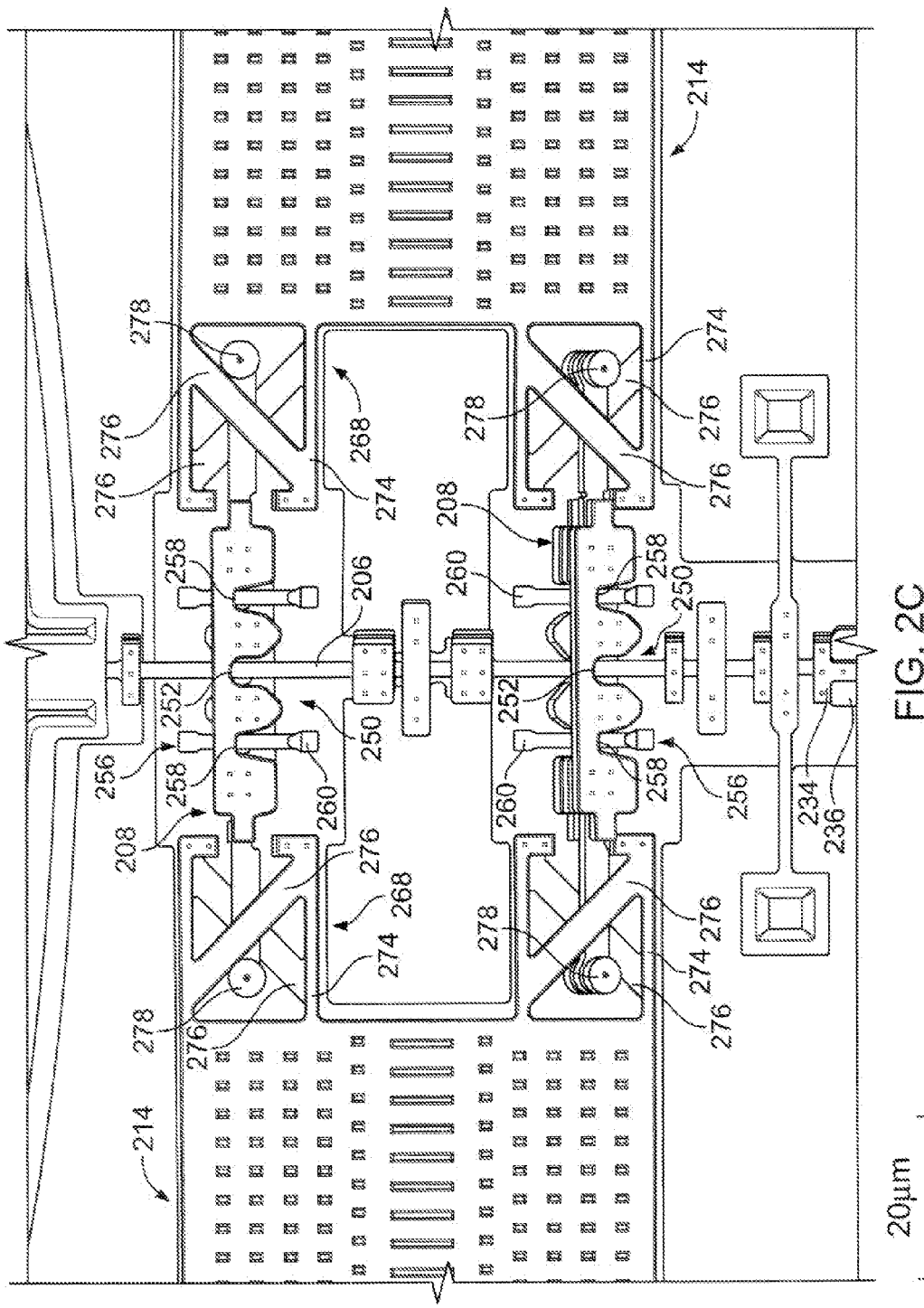
Figure 2D:
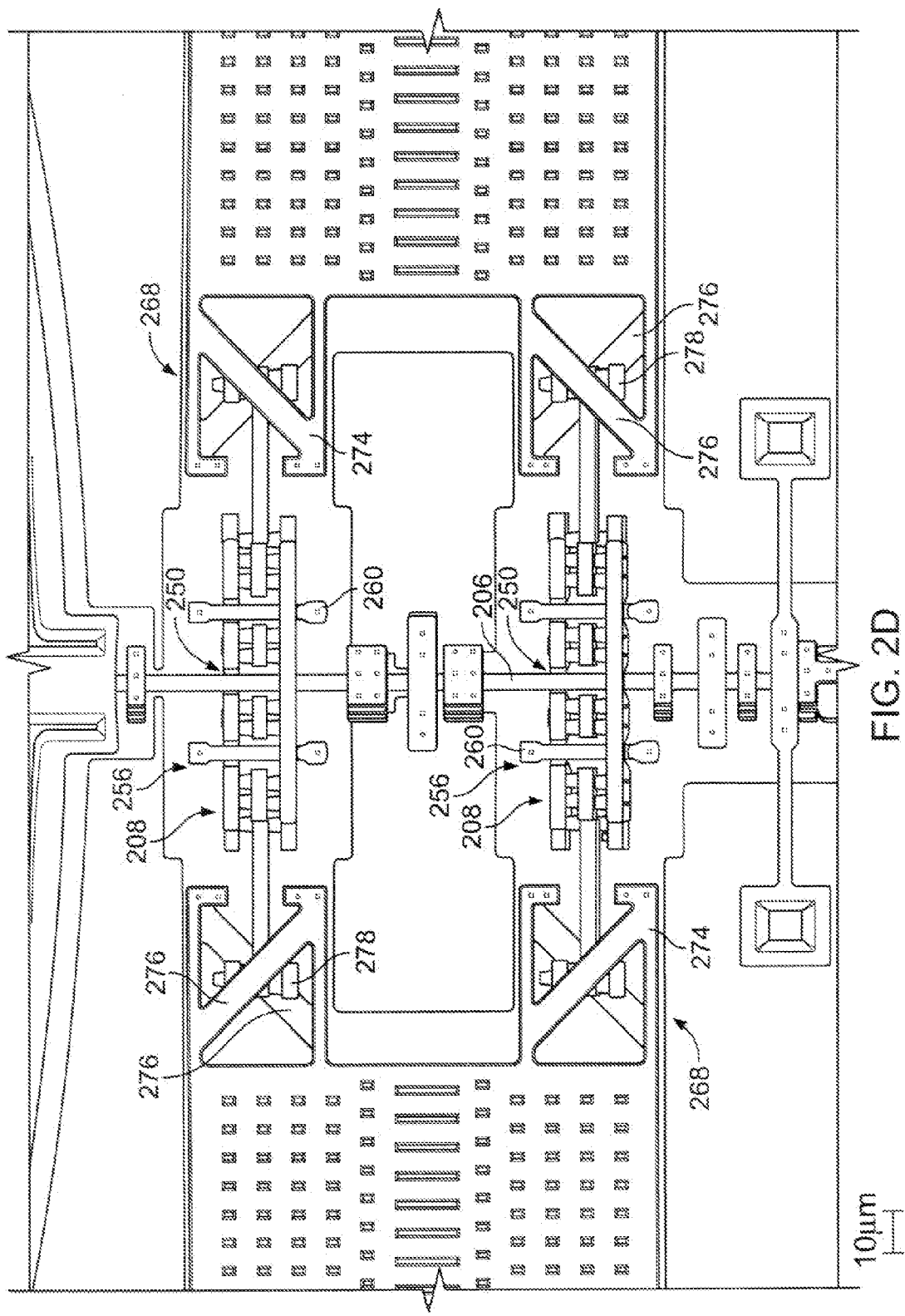
Figure 2E:
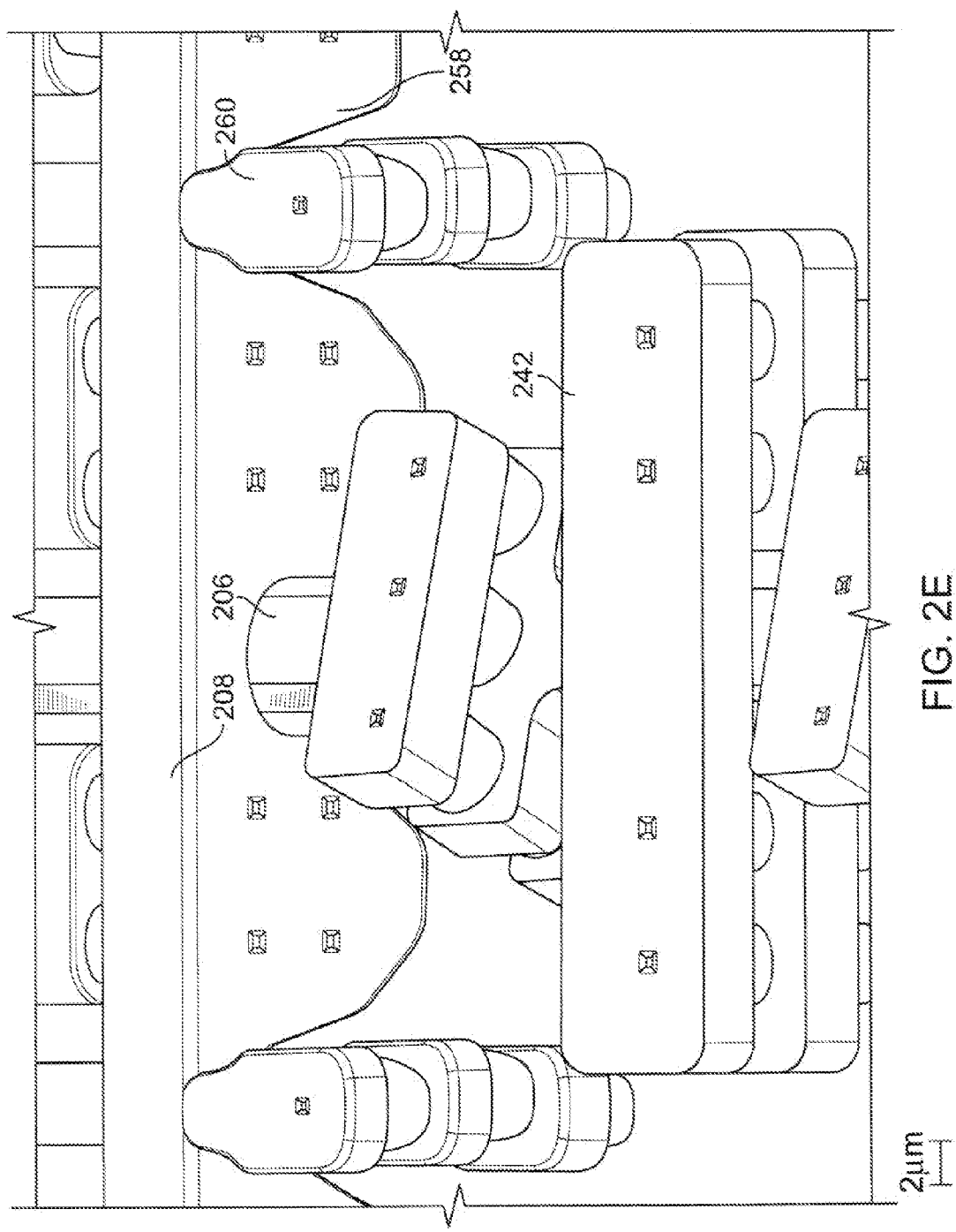

Referring to FIGS. 2C-E in connection with FIG. 2A, the micro bearing assemblies 208 are fabricated in-plane and deployed out-of-plane with the substrate 216. The bearings of micro bearing assemblies 208 support and reduce rotational friction for the shaft 206. In the illustrated embodiment, each micro bearing assembly 208 comprises a bearing 250 and an alignment system 256. The bearing 250 may include offset but connected components that each include a half bearing hole 252. As sued herein, "each" means every one of at least a subset of identified items. Further information on bearing construction is described in connection with FIGS. 9A-C.

In one embodiment, the half bearing holes 252 are rounded. In other embodiments, the half bearing holes 252 are otherwise shaped, such as not squared. In some embodiments, the half bearing holes may be squared. Upon deployment, the half bearing holes 252 together form a horizontally offset bearing hole 254 that may surround the shaft 206. For example, one half may be outwardly oriented of an upper portion of the shaft 206 while a second half is inwardly oriented of a lower portion of the shaft 206. The components of the bearing 250 may be interconnected by anchors and post as previously described. In another embodiment, the each half may be separately deployed and/or the bearing 250 may comprise a partial hole or aperture. For example, the bearing may comprise a half hole or a deep channel.

The alignment system 256 may comprise one or more alignment grooves 258 formed in the same components as the bearing 250 and corresponding alignment bars 260. Each alignment groove 258 may be V-shaped to capture the corresponding alignment bar 260 and then pull the alignment groove 258 and thus the bearing 250 into alignment during deployment. In a particular embodiment, the alignment system 256 includes an alignment groove 258 and bar 260 on each side of the bearing hole 254. In this and other embodiments, the bearing may have a prescribed and "designed-in" tolerance (e.g., 100 nanometers or less). The bearing 250 may be otherwise configured and/or aligned. For example, the half bearing holes 252 may be configured so that the two halves of the deployed bearing 250 form a veritcally oriented hole for the shaft or they may be configured so that the two halves 252 of the deployed bearing in their vertical orientations are horizontally offset from each other with a prescribed and "designed-in" tolerance (e.g., tens of nanometers to several microns). In other embodiments, the alignment system 256 or even the bearing 250 may be omitted.

The bearing deployment system 214 rotates, moves, transforms, positions or otherwise deploys the bearings 250 into engagement with the shaft 206. Engagement may occur when the bearing 250 is operatively or otherwise suitable associated with the shaft 206. For example, when correctly positioned within specified tolerances to support rotation of the shaft 206. As described above, the bearings 250 may be moved out-of-plane from a fabrication or other position to a use position.

In the illustrated embodiment, the bearing deployment system 214 comprises a set of actuators 262, extension links 264, bearing locks 266 and bearing rotation systems 268 that deploy the bearings 250 post fabrication. The bearing deployment system 214 may include fewer, additional, or different components. In addition, one or more of the components may be fabricated or reside on a separate substrate 216. Furthermore, the bearings 250 may be otherwise suitable deployed.

The actuators 262 may be thermal actuators as described in connection with the actuator 202 or other suitable actuators. The extension links 264 may each comprise a slide 270 disposed between guides 272. In a particular embodiment, the slide 270 may engage a groove or channel in the guide 272 to, for example, reduce or prevent vertical movement of the slide 270 and/or to facilitate lateral movement of the slide 270 during bearing 208 deployment. As above, dimples may be used on the slide 270 to guide in place and to reduce friction as it moves.

The bearing locks 266 each reduce or prevent backward movement of the associated slide 270 after bearing 250 deployment. In the illustrated embodiment, the bearing locks 266 comprise one or more sets of teeth biased into engagement that allow the slide 270 to move outwardly away from the shaft 206 for deployment but that prevent inward movement of the slide 270. A more detailed view of a bearing lock is illustrated in FIG. 5A. The bearing locks 266 may be otherwise configured or omitted.

The bearing rotation systems 268 deploy the bearings 250 in response to outward movement of the extension links 264 and thus the actuators 262 (i.e., on-chip actuation). Each bearing rotation system 268 may comprise a X-crank system 274 connected or otherwise coupled to the opposing extension links 264. The X-crank system 274 includes upper and lower wedges 276 disposed above and below a bearing extension with cranking columns 278. In the illustrated embodiment, the cranking columns 278 are in a vertical orientation after fabrication and before bearing 250 deployment.

The X-crank system 274 moves with the thermal actuators 262 and extension links 264. During outward movement of the X-crank system 274, the upper and lower wedges 276 engage the then veritcally oriented cranking column 278 and turn it ninety (90) degrees from a vertical orientation to a horizontal orientation. More specifically, the upper and lower wedges 276 push distal ends of vertically oriented cranking column 278 in opposite directions to rotate the cranking column 278 and thus the bearing ninety (90) degrees.

For deployment, a voltage potential input via a probe, circuit lead, circuit lead of circuit lead frame or other device is applied across ports or pads 265 of the expansion members of the thermal actuators 262 (i.e., on-chip actuation). In response to thermal expansion, the expansion members pull on the extension links 264 to deploy bearings 250 with a ninety (90) degree rotation into final position as shown in FIG. 2D. As used herein, an action "in response to" an event means that the action occurs at least in response to the event. Thus, other actions may be needed, desired, and/or intervene. During the ninety (90) degree turn, the alignment system 256 governs the precise 3-D positioning of the bearings 250 about the shaft 206 as shown by FIGS. 2C-E. The bearing locks 266 hold the extension links 264 fixed at their extended position.

Figure 2F:
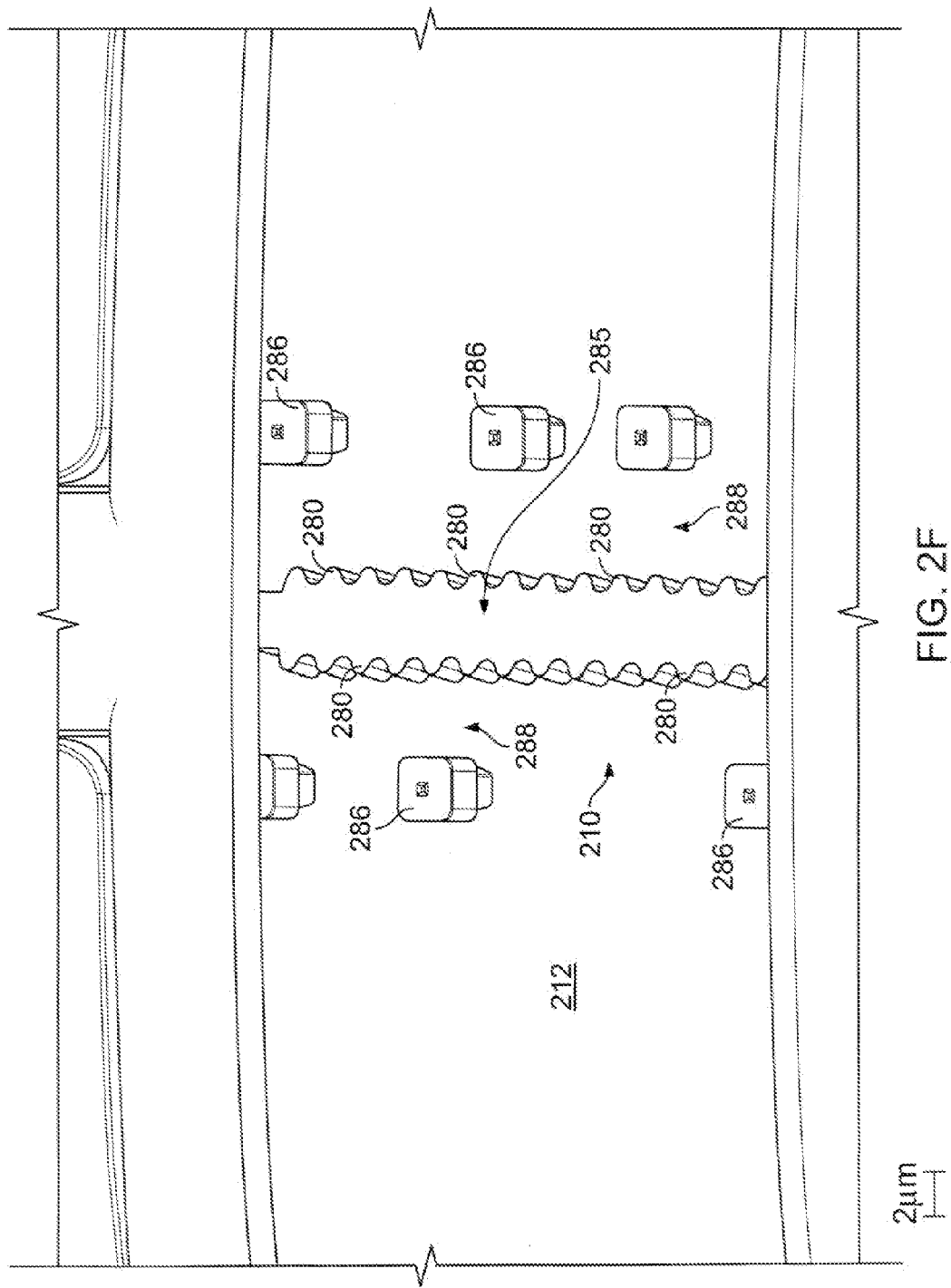

Referring to FIG. 2F in connection with FIG. 2A, the tool 210 is attached to and driven by the shaft 206. The shaft 206 and tool 210 may rotate together as one continuous unit. In other embodiment, the tool 210 may be driven by a transmission or gear that in turn is driven by the shaft 206 or otherwise. As previously described, the shaft 206, and thus the tool 210, may rotate at 500 RPM's or other suitable rotational speeds.

The tool 210 is disposed in the fluidic channel 212. In the illustrated embodiment, the tool 210 comprises a bank of teeth, or micro blades, 280 forming a cutter 285. In this embodiment, the tool 210 lyses cells (i.e., breaks through the cells' membrane for removal of cell inner parts including DNA) flowing in the fluidic channel 212 from an inlet 282 to an outlet 284 as shown in FIG. 2H. The inlet 282 and outlet 284 may be DRIE cut as described above.

Stops 286 may be located in micro fluidic channel 212 provide confinement regions 288 between tool 210 and stops 286 for assisting in the cell lysing process. After cells are lysed by tool 210, the lysed parts flow through fluidic channel 212 to the outlet 284. The mirco blender 200 may be used for lysing other artifacts and/or for mixing or other suitable applications. In addition, a plurality of cutters/mixers may be used. For example, counter-rotating/counter-moving or fixed bladed shafts with cutters/mixers may be configured with horizontal and or vertical offset relative to moving tool 210 and work in conjunction with each other to aid in lysing, cutting, shearing, grinding, mixing, and the like. In these embodiments, a single shaft 206 or multiple shafts 206 may drive the plurality of tools or tool elements.

Figures 1, 2G:
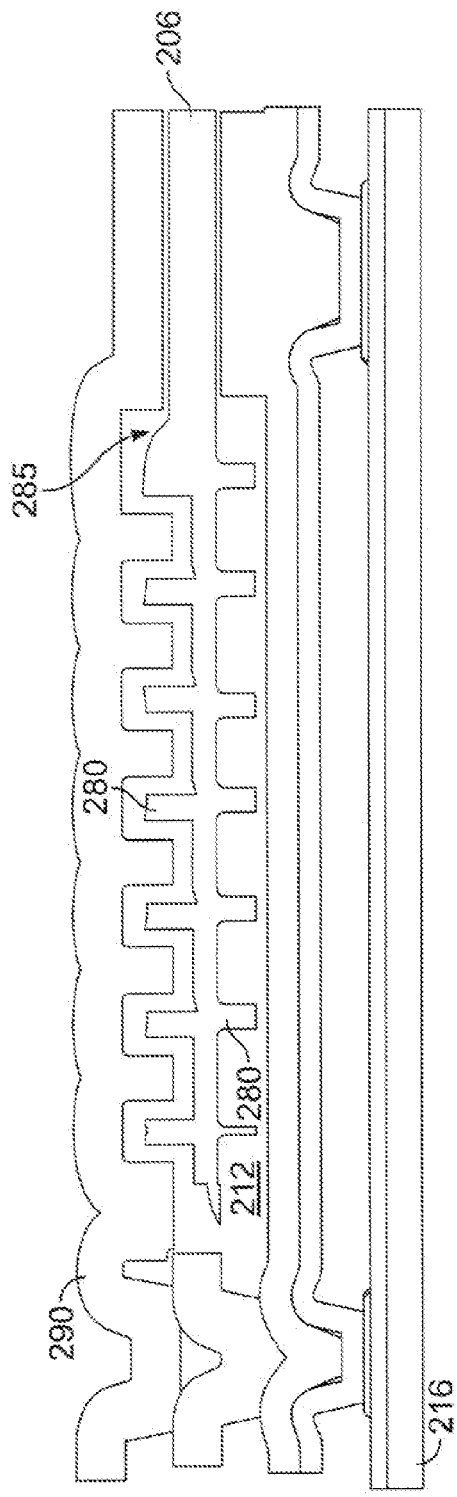
Figures 2, 2G:
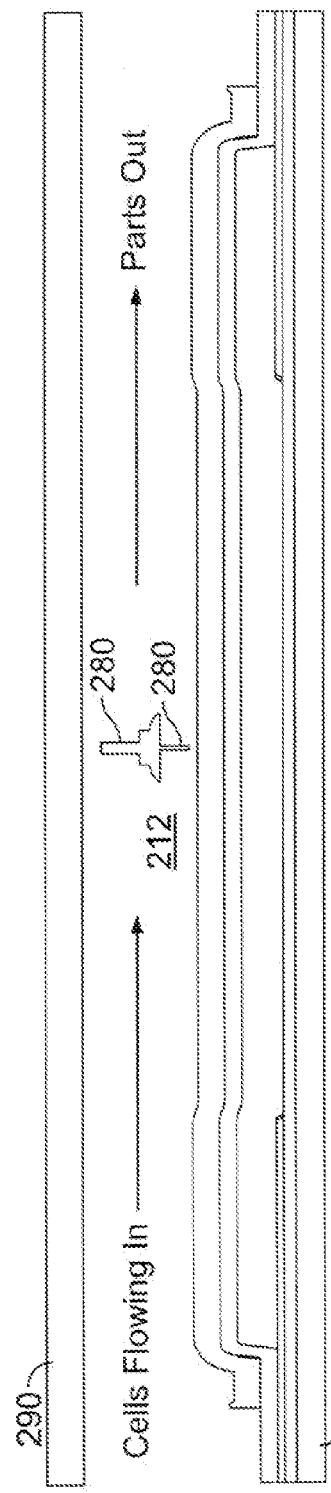
Figure 2H:
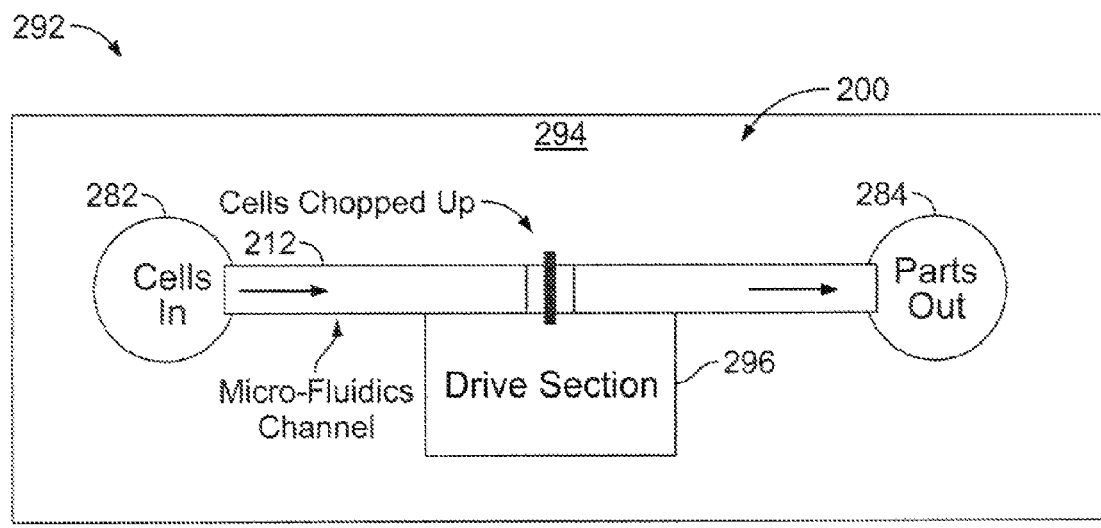

Referring to FIGS. 2G-1 and 2G-2, a cross sections of the channel 212 at the cutter 285 is illustrated. In this embodiment, the teeth, or blades, 280 are about one (1) micron and the shaft is about two (2) microns square. A cover 290 covers the micro fluidic channel 212 and extends down between teeth 280. The top of the cover 290 may be ten (10) microns from the substrate 216. The micro fluidic channel 221 may be, for example, as little as six (6) microns high. The cover 290 may be a nitride or other suitable layer deposited over a sacrificial layer filling the channel 212 during fabrication or may plastic or other suitable material bonded to top of micro fluidic channel 212. In the deposition embodiment, the sacrificial layer may be etched from the micro fluidic channel 212 through inlet 282 and 284 as well as through an opening where the shaft 206 enters the micro fluidic channel 212. In the bonding embodiment, a rectangular structure 298, as shown in FIG. 2A, may be used to support the cover 290.

Referring to FIG. 2H, the micro blender 200 implemented as a MEMS chip 292 is illustrated. In this embodiment, the micro blender 200 is fabricated in thin films on a chip 294. The chip 294 may be about six (6) mm by three (3) mm in size. On the chip 294, the micro actuator 202, micro transmission 204, micro shaft 206, micro bearing assembly 208 and other components may be implemented in a drive section 296 abutting the micro fluidic channel 212 extending between inlet 282 and outlet 284. The in-plane horizontal shaft (horizontal with respect to the chips substrate) may, in some embodiments, use a substantial amount of real estate in the plane of the substrate 294 and may allow the micro blender 200 to be fabricated in 10 microns elevation on the substrate 294.

The micro blender 200 may be fabricated using the SUMMiT V™ fabrication process, which is a five-layer polycrystalline silicon surface micromachining process (the P0 ground plane/electrical interconnect layer and the four mechanical/structural layers P1 through P4). SUMMiT V™ alternately deposits a film, photolithography patterning the film, and then performs chemical etching. By repeating this process with layers of silicon dioxide and polycrystalline silicon, extremely complex, inter-connected three-dimensional shapes can be formed. The photolithographic patterning is achieved with a series of two-dimensional "masks" that define the patterns to be etched. The SUMMiT V™ process uses 14 individual masks in the process, approximately the same quantity as in many CMOS IC processes.

For the SUMMIT V™ process, a single-crystal silicon wafer may be used. The wafer may be N-type for compatibility with poly doping. The wafer may be CZ (Czochralski) grown with a polished surface. One or more layers of sacrificial oxide may be used between mechanical/structural layers. Sacrificial oxide may be deposited on silicon in diffusion furnaces with oxygen, dry or steam (wet), at temperatures of 850-1150° C. Thermal oxidation of silicon may generate compression stress as thermal expansion difference and silicon dioxide takes more volume than silicon. The sacrificial oxide may be patterned using photoresist, which may be spun on. Resist thickness may, for example, be 0.5-5.0 microns. Thinner resist may be used for defining finer features of the micro machine 2. A sensitizer may be used to prevent dissolution of unexposed resist during development. The photoresist may be exposed to light through a dark field mask. The light, for example, 200-450 nano meters (nm), breaks the sensitizer, causing exposed regions to dissolve in the developer solution.

An oxide etch may be used to etch any oxide not protected by the photoresist. The etch may be wet or dry and isotropic or anisotropic. For example, a wet oxide etch may be a hydrofluoric (HF) etch. A dry oxide etch may be fluorine based chemistry such as $CHF_3$ or $C_2F_6$. Other etches may be a sputtering ion etch, a chemical plasma etch, an ion-enhanced energetic plasma etch, or an ion-enhanced inhibitor etch. In one embodiment, the etch is selected based on the desired sidewall profile. A post etch may be used to remove or strip photoresist using plasma and/or solvent.

The mechanical/structural layers may be deposited layers of polysilicon. Conformal deposition may coat the underlying topography and provide step coverage. The polysilicon may be doped in-situ, using phosphine ($PH_3$) for N-type or diborane ($B_2H_6$) for P-type. Silicon deposition may, for example, be low-pressure chemical vapor deposition (LPCVD (poly)) or plasma enhanced chemical vapor deposition PECVD (amorphous). LPCVD silane pyrolysis may typically be at 550-700° C. Below 600° the film is amorphous.

Deposited layers may be annealed. Typically, if annealed at 900° C. or above, stress relaxation occurs. Light sensitive photoresist may be spun on as described above. A clear field mask may be used to expose photoresist to light using a polysilicon mask. As above, resist in exposed regions dissolves in the developer solution as light breaks down the sensitizer in the resist.

A silicon etch etches away polysilicon not protected by photoresist. The resist protects the defined regions during etch. The silicon etch may be wet or dry. Dry silicon etch may be, for example, fluorine based chemistry such as $SF_6$ or $C_4F_8$. A deep reactive etch may be used for high aspect ratios. As above, the etch may be selected based on side wall profile. As also above, the photoresist may be removed by a post etch as described above.

This process of deposition and etching sacrificial and structural layers may be repeated any number of suitable times. Sacrificial oxide may, in one embodiment, be etched away to release moveable structures and complete processing. A wet HF based chemistry etch may be used for release. Release is further described below in connection with FIG. 6.

In one SUMMiT V™ embodiment of the micro blender 200, the shaft 206 and tool 210 are fabricated using the P3 mechanical/structural layer, the bearing components and the upper and lower wedges 276 are fabricated using the P1/P2 mechanical/structural layer and the P4 mechanical/structural layer, and the cranking columns 278 are fabricated using the P1, P2, P3, and P4 mechanical/structural layers. In other embodiments, the shaft 206 and tool 210 may be fabricated using the P2 mechanical/structural layer, the bearing components 250 and the upper and lower wedges 276 may be fabricated using the P1 mechanical/structural layer and the P3 mechanical/structural layer, and the cranking column 278 may be fabricated using the P1, P2, and P3 mechanical/structural layers. The structural layers may, in one embodiment, be separated by about two (2) microns. In still other embodiments, the shaft 206, tool 210, and other components of the micro blender 200 may be fabricated using nitride layers and/or other materials used in the semiconductor industry in addition to polycrystalline silicon layers.

Other suitable processes can be used to fabricate the micro blender 200 or various parts of the micro blender 200. For example, the Sandia National Laboratories' SwIFT™ process may also be used. The SwIFT™ process uses nitride layers in addition to the SUMMiT V™ fabrication process. The SUMMiT V™, SwIFT™, various LIGA processes and other processes can be used to fabricate any embodiment of the micro machine 2 or various parts of the micro machine 2.

FIGS. 3A-E illustrate one embodiment of a micro transport machine. A transport machine is powered to itself move and/or elements or material in performing tasks. The micro transport machine may have any suitable drive component and may be driven and steered using any suitable wireless power source such as electro-magnetic fields. In this embodiment drive component may be magnet. In other embodiments, the drive component may be a material or device responsive to a drive signal or energy.

The micro transport machine may not be tethered, may be free ranging, may be steerable to any area on or off the substrate and/or may move in 3D to different levels of the substrate as well as off the substrate. In the illustrated embodiment, the micro transport machine is a micro vehicle 300. Micro vehicle 300 may be used for transporting materials on a chip, performing general robotic functions at micro levels, and other suitable applications.

Figure 3A:
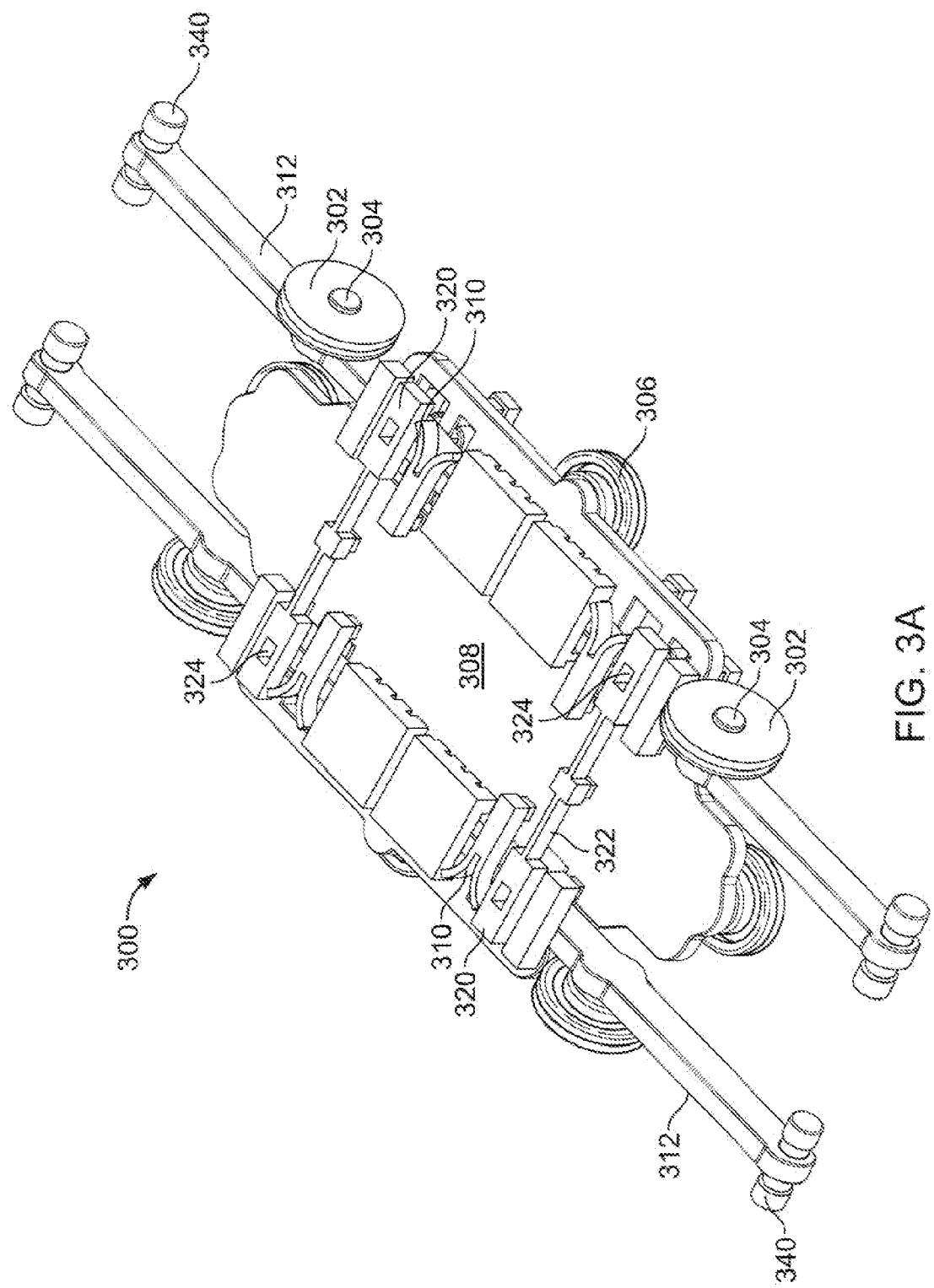

Referring to FIG. 3A, the micro vehicle 300 in its fully deployed form includes vertically oriented wheel 302, wheel axle 304, bumpers 306, space for magnet 308, 3-D positioning and guide system 310, body axle 312, locking system 320, and cranking pins 340 for deploying micro vehicle 300. The micro vehicle 300 may include additional or other components. In addition, one or more of the components may be fabricated or reside on a separate substrate or be omitted.

The body axle 210 extends from front to back on both sides of the micro-vehicle 300. As shown in FIG. 3C, the body axle 312 comprises wheels 302, wheel axle 304, guide pin 314 of 3-D positioning system 310, locking pin 316 of locking system 320, and cranking pin 340. As shown in FIG. 3A, magnetic material can be prefabricated on the bed of micro-vehicle in the space for magnetic material 308 or, alternately, it may be welded onto the bed in space 308 after fabrication and release by using specialized tools in a scanning electron microscope (SEM) machine.

Figure 3B:
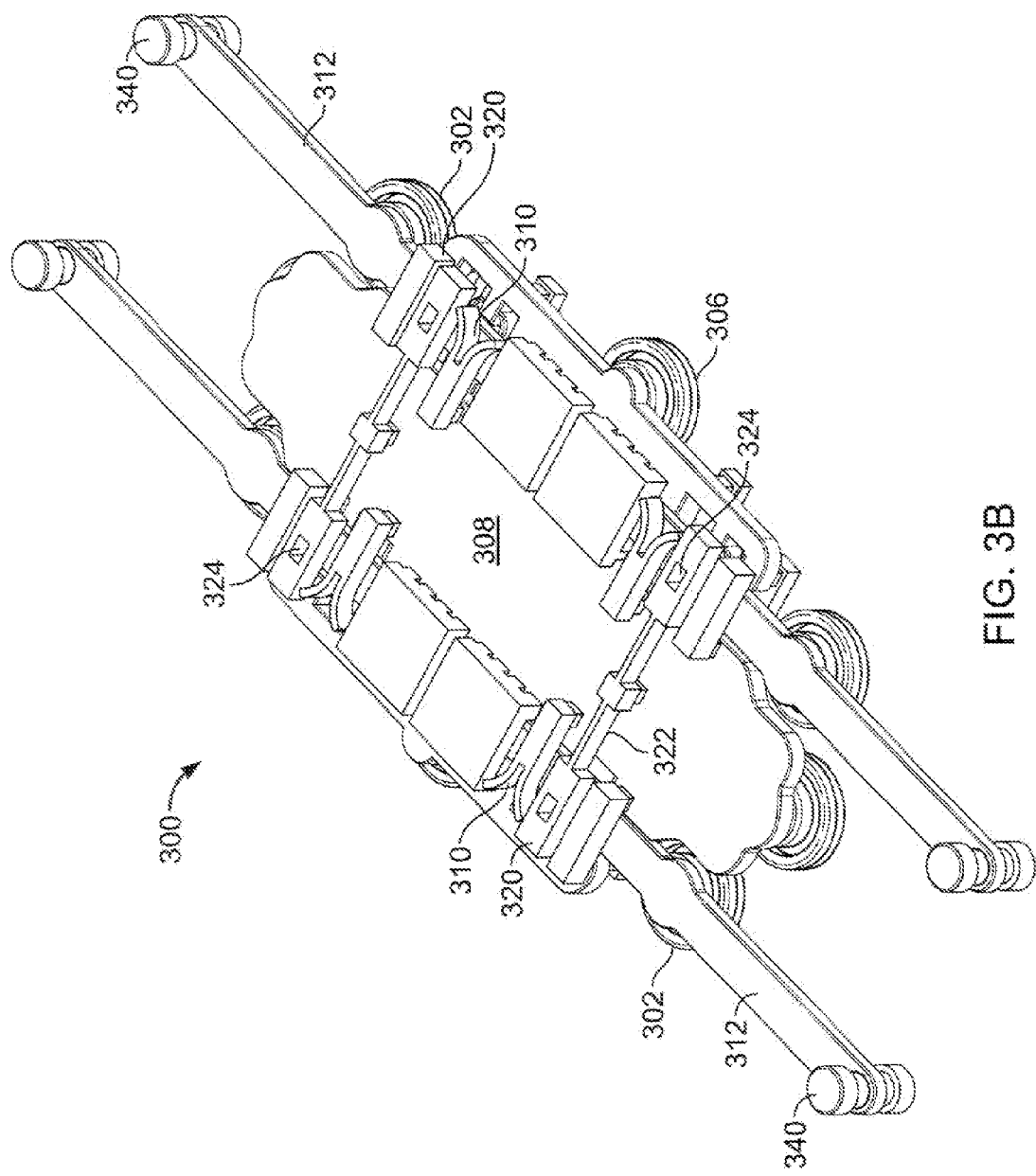
Figure 3C:
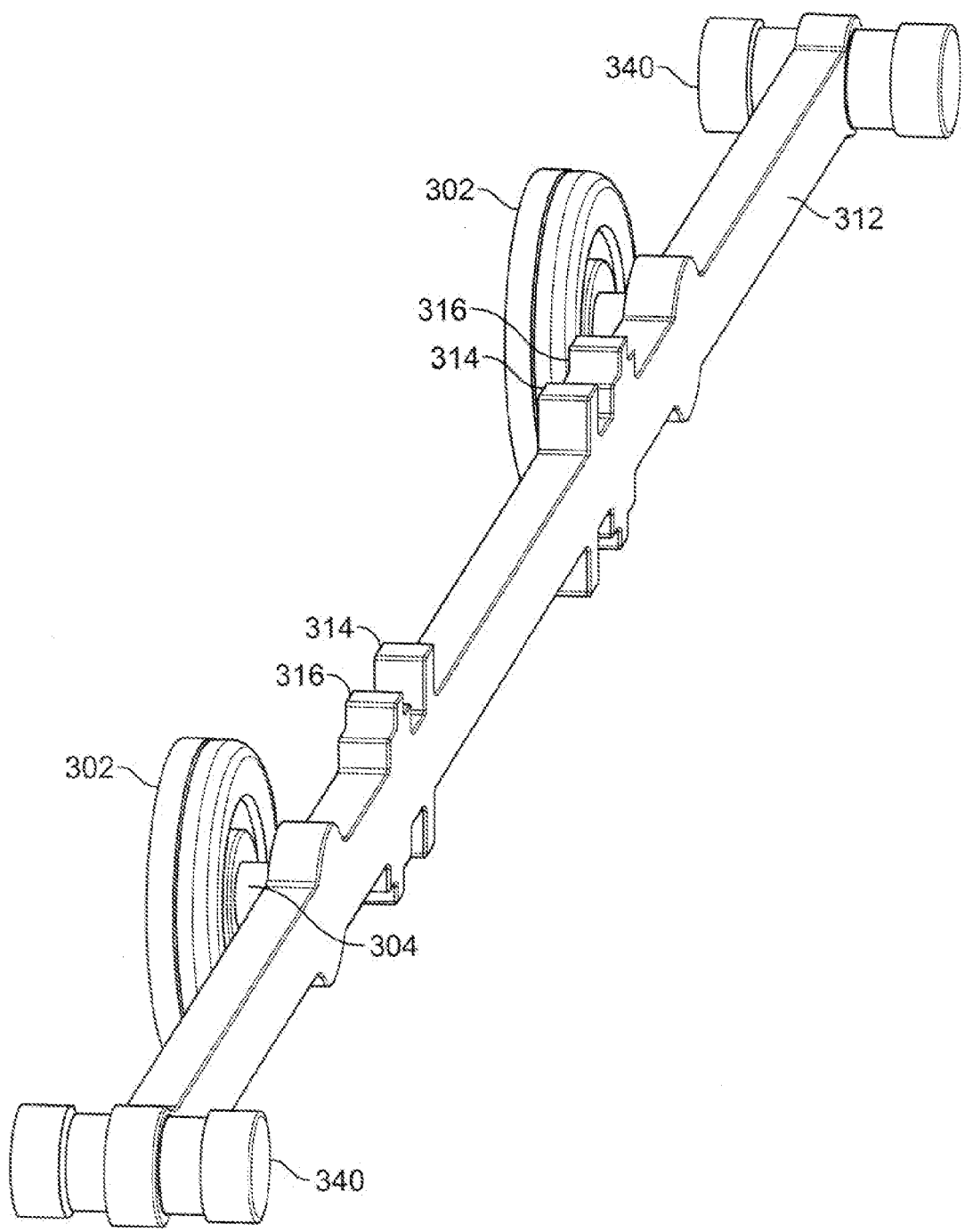

Referring to FIG. 3B, the micro vehicle machine 300 in its pre-deployed form includes horizontally oriented wheels 302, axles 304, bumpers 306, space for magnet 308, 3-D positioning and guide system 310, body axle 312, locking system 320, and cranking pins 340 for deploying micro vehicle 300. The wheels 302 with "rotatable rim about an axle or shaft", as an example, could be made or configured using Sandia's pin-joint-cut layer in SUMMiT V™. For the deployment of the wheels 302, the cranking pins 340 are turned ninety (90) degrees so that each wheel 302 is turned ninety (90) degrees from its horizontally fabricated orientations to its vertically deployed orientation as shown in FIGS. 3A and 3C.

Referring to FIGS. 3A-B, the 3-D positioning system 310 may have a V-shaped entrance for guiding the guide pins 314 into final position. The locking system 320 may have spring-like cantilevers 322 extending from the middle of the vehicle as shown in FIGS. 3A-B so that its locking pins 316 attached to the body axle 312 may push up the spring-like cantilevers 322 and lock permanently into the slotted holes 324 of locking system 320.

Referring to FIG. 3D, components similar to those used in the micro blender 200 for deploying micro bearing assembly 208 may be used in the deployment of wheels 302 and deployment of the micro vehicle 300 from its fabricated position. In particular, such components may be, for example, a thermal actuator, a micro bearing deployment system, extension links, and locks. As the body axle 312 is turned ninety (90) degrees as shown in FIGS. 3A and 3C, the guide pins 314 of the 3-D positioning system 310 and the locking pins 316 of the locking system 320 center the position of the body axle 312 and its attached front and back wheels 302 in their deployed, or final, positions as shown in FIG. 3A.

Figure 3E:
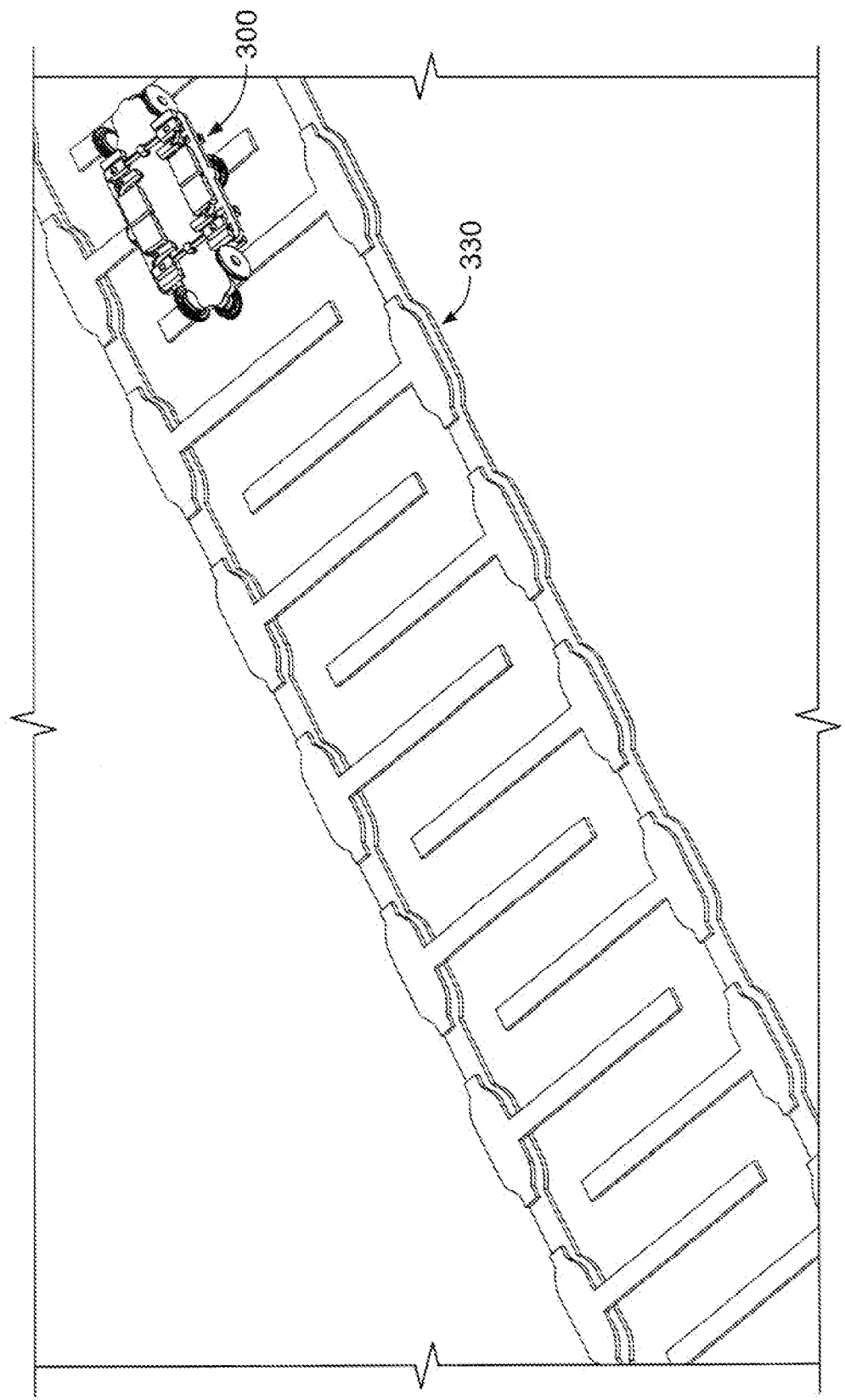

In a particular embodiment, micro-vehicle 300 may have wheel diameters in the range of 8-15 microns and up, wheels the size of red blood cells, widths in the range of 20-30 microns and up, and lengths in the range of 40-75 microns and up. These micro-size vehicles may be used to perform robotic multitasking functions on-chip and to be driven/powered by electrostatic, electromagnetic, electrokinetic systems/fields, or by any other means. As shown in FIG. 3E, the micro vehicle 300 may travel on a track 330 using traveling wave dielectrophoresis.

The SUMMiT V™, SwIFT™, and various LIGA processes and others like them can be used to fabricate various embodiments of the micro vehicle 300. In the SUMMiT V™ fabrication embodiment of the micro vehicle 300, the wheels 302 and bumpers 306 are fabricated using the P1/P2 mechanical/structural layers, the body axle 312 is fabricated using the P3 mechanical/structural layer, and the locking system 320 and spring-like cantilevers 322 are fabricated using the P1/P2 mechanical/structural layer and the P4 mechanical/structural layer. In other embodiments, the body axle 312 may be fabricated using the P2 mechanical/structural layer and the locking system 320 and spring-like cantilevers 322 may be fabricated using the P1 mechanical/structural layer and the P3 mechanical/structural layer. In still other embodiments, the various components of the micro vehicle 300 may be fabricated using nitride layers and/or other materials used in the semiconductor industry in addition to polycrystalline silicon layers.

FIGS. 4A-D illustrate various embodiments of actuator 14. Other suitable actuators 14 may be used for the micro blender 200, micro vehicle 300, and other micro machine 2 applications.

Referring to FIG. 4A, a single thermal actuator 400 as described in connection with micro blender 200 is illustrated. The thermal actuator 400 provides reciprocating motion 402 to drive a shaft 10, transmission 16, tool 18 or other device.

Referring to FIG. 4B, a multiple thermal actuator assembly 410 is illustrated. The thermal actuators are positioned in a tandem configuration to create in-plane reciprocating (i.e., push and pull) motion. In a specific embodiment, the thermal actuators may be in a double configuration with opposing V-shape structures. A first thermal actuator 412 may produce a pulling motion in first direction and a second thermal actuator 414 may produce a pushing motion in a second, opposite direction to provide reciprocating rectilinear motion 416. The use of thermal actuators in a tandem configuration may mimic the push/pull motion of a micro engine, such as Sandia's micro engine described in connection with FIG. 4D.

Referring to FIG. 4C, a torsional ratcheting actuator (TRA) 420 is illustrated. As shown, the TRA 420 provides in-plane rotational movement 422. The TRA 420 has a multitude of inner banks of electrostatic comb drive arrays 424 that ratchet an outer ring gear 426. When the comb drive arrays 424 are electrostatically actuated, they make an angular displacement that is sufficient for rotating and ratcheting the outer ring 426 gear at least one tooth.

Referring to FIG. 4D, a micro engine 430 is illustrated. The micro engine 430 may be Sandia's micro engine. In this embodiment, the micro engine 430 provides reciprocating motion 432. The micro engine 430 has two main sets of electrostatic "comb drive" bands 434 that are attached to a central longitudinal ram 436. When electrostatically actuated, one set is used to drive the ram 436 in the forward direction and the other set is used to drive the ram 436 in the reverse direction.

Advantages of using actuators 400 and 410 instead of a micro engine 430 or TRA 420 may be twofold. First, the single and double thermal actuator system 400 and 410 may have a chip footprint that is less than ten percent that of the micro engine 430. For example, the double thermal actuator system 410 may have a footprint of one (1) millimeter by 100 microns. Second, the double thermal actuator system 410 provides one hundred (100) to one thousand (1000) times more force than that of the micro engine 430. For example, the double thermal actuator system 410 may provide millinewtons of force. Advantages of using the micro engine 430 instead of actuators 400 and 410 may include lower power requirements and far higher drive frequency rates as a thermal actuator is limited to about one thousand (1000) Hz. Advantage of using a TRA 420 may include that it can turn the horizontal shaft 10 incrementally "degree-by-degree" via its ratcheting mechanism.

FIGS. 5A-E illustrate various embodiments of the micro transmission 16. The micro transmission 16 transmits power between components such as from a thermal actuator or other micro actuator 14 to a horizontal rotating shaft 206, other drive shaft or device. The micro transmission 16 may convert or otherwise transfer one type of motion into a different type of motion. The micro transmission may include an input shaft coupled to the micro actuator 14 and an output shaft coupled to the micro shaft 10. The input and output shafts may include gears, slides, pins and the like. One or more power conversion elements convert a first type of movement, or motion, from the input shaft to a second different type of movement, or motion for the output shaft. Other suitable types of micro transmission 16 may be used. For example, the micro transmission 204 illustrated in connection with the micro blender 200 may be used for any suitable application.

FIGS. 5A-B illustrate one embodiment of a micro transmission 500 for converting in-plane (i.e., in the plane of the substrate) reciprocating motion 506 into in-plane (x-axis) rotational motion 508. The micro transmission 500 may be powered by double thermal actuators 502 to drive a micro shaft 505 and a micro tool 504. The micro transmission 500 may be used for other suitable applications such as converting reciprocating motion in any plane, including out-of-plane, into rotational motion in that plane.

Referring to FIG. 5A, the double thermal actuators 502 may be used to create in-plane reciprocating (i.e., push and pull) motion, as described in connection with FIG. 4B. Referring to FIG. 5B, the micro transmission 500 comprises cranking mechanisms 510 and 520 which includes input shafts and power conversion elements of the transmission. Cranking mechanism 510 turns micro shaft 505 ninety (90) degrees during a pulling motion of powered actuation. The cranking mechanism 520 turns micro shaft 505 ninety (90) degrees during a pushing motion of powered actuation. Cranking mechanism 510 comprises an upper wedge 512, a lower wedge 514, a (illustrated as vertically oriented) cranking column 516 attached to micro shaft 505, and a shuttle guide 518. Cranking mechanism 520 comprises an upper wedge 522, a lower wedge 524, a (illustrated as horizontally oriented) cranking column 526 attached to micro shaft 505, and a shuttle guide 528. The cranking columns 516 and 526 for part of the power conversion elements which the shaft 505 includes the output shaft of the transmission 500. In other embodiments, the output shaft may be distinct or non-internal with shaft 505.

In operation, the micro transmission 500 rotates micro shaft 505 and drives micro tool 504. During a pulling motion by thermal actuator 502a, shown in FIG. 5A, the cranking mechanism 510 slides in shuttle guide 518 so that wedges 512 and 514 engage cranking column 516 and turn the following items ninety (90) degrees: the cranking column 516, the micro shaft 505, and the cranking column 526. At the end of the pulling cycle, the cranking column 516 is turned ninety (90) degrees from a vertical orientation into a horizontal orientation and the cranking column 526 is turned ninety (90) degrees from a horizontal orientation into a vertical orientation.

During a pushing motion by thermal actuator 502b, the cranking mechanism 520 slides between shuttle guides 518 and 528 so that wedges 522 and 524 engage cranking column 526 and turn the following items ninety (90) degrees: the cranking column 526, the micro shaft 505, and the cranking column 516. At the end of the pushing cycle, the cranking column 526 is turned ninety (90) degrees from a vertical orientation into a horizontal orientation and the cranking column 516 is turned ninety (90) degrees from a horizontal orientation into a vertical orientation. The one cycle reciprocating action of the pulling and pushing motions on transmission 500 provides one hundred eighty (180) degrees rotation of the micro shaft 505. Two such cycles provide a complete three hundred sixty (360) degrees rotation of shaft 505.

FIGS. 5C-E illustrate one embodiment of a micro transmission 530 for converting out-of-plane (i.e., perpendicular to substrate) rotation 536 into in-plane (x-axis) rotational motion 538 via reciprocating motion 539. The micro transmission 530 may be powered by TRA 532 to drive a micro shaft 535 and a micro tool 534. Micro transmission 530 may be otherwise used for converting rotational motion to a different rotational motion, rotational motion an intermediation or final reciprocating motion, and other suitable applications. For example, micro transmission 530 may convert rotation in any plane, including in-plane, into rotational motion in any other plane, including out-of-plane.

Referring to FIG. 5C, the TRA 532 may be used to create an out-of-plane (z-axis) rotation 536 as described in connection with FIG. 4C. Referring to FIG. 5D, the micro transmission 530 comprises connected micro transmission 540 and 550. Micro transmission 540 converts out-of-plane rotation 536 into in-plane reciprocating motion 539. Micro transmission 550 converts in-plane reciprocating motion 539 into in-plane rotation 538 of micro shaft 535 and micro tool 534.

The micro transmission 540 comprises a gear 542 attached to a powered device such as TRA 532, a gear 548 driven by gear 542 of TRA 532, a pin 544 attached to gear 548 that drives slider mechanism 546. Gear 548 is composed of slider 570 and arm 572 which are shown in FIG. 5B. Arm 572 is attached via a "pin-in-slot" to gear 542 as shown in FIG. 5E. The rotating gear 542 of the micro transmission 540 converts out-of-plane rotational motion 536 into in-plane reciprocating motion 539 of the slider mechanism 546.

Referring to FIG. 5E, the inner structure of the micro transmission 540 is illustrated. In this embodiment, a first block 570 slides back and forth as gear 542 rotates. Slider mechanism, or block, 546 also slides in reciprocating motion. Arm 572 is attached to blocks 546 and 570. The difference in distance between the points where the arm 572 attaches to the blocks 546 and 570 determines the output magnitude of the reciprocating motion of the micro transmission 540.

Referring back to FIG. 5D, the micro transmission 550 comprises a shuttle guide 552 for slider mechanism 546, an upper wedge 554, a lower wedge 555, a (illustrated as vertically oriented) cranking column or pin, 556, and a (illustrated as horizontally oriented) cranking column pin 558. In operation, during reciprocating motion of the slider mechanism 546 in the shuttle guide 552, the wedges 554 and 555 engage and turn the pins 556 and 558 ninety (90) degrees and then another ninety (90) degrees in a two-sequence one hundred eight (180) degrees cycle. Two such cycles provide a complete three hundred sixty (360) degrees rotation of shaft 535 and tool 534.

In the SUMMiT V™ embodiment, the micro transmission 540 may have the arm fabricated in the P3 layer, the slider mechanism 546 in the P4 layer, and the block 570 in the P2 layer. The micro transmission 540 may be otherwise suitably constructed.

FIG. 6 illustrates a method for manufacturing the micro machine 2 in accordance with one embodiment of the disclosure. In this embodiment, the micro machine 2 is an integrated on-chip, or single substrate, system such as the micro blender 200 or the micro vehicle 300. The micro machine 2 may be otherwise suitably manufactured.

Referring to FIG. 6, the method begins at step 600 in which the micro machine 2 is fabricated. As described above, the micro machine 2 may be fabricated using suitable processes and materials. For example, the micro machine 2 may be fabricated in ceramics, metals, polymers and/or silicon using surface micromachining electroplating and/or molding processes. Surface micromachining comprises fabrication of structures using thin films and patterning via photolithography. Surface micro machining may fabricate structures through alternate deposition and patterning of sacrificial and structural materials. Specific exemplary processes include SUMMiT V™ and LIGA.

Proceeding to step 602, parts, or structures, of the fabricated micro machine 2 are released. In one embodiment, sacrificial material is removed to release moving parts that were supported or held immobile by the sacrificial material is removed to release moving parts that were supported or held immobile by the sacrificial material. The moving parts may be, for example, flexible or cantilever style arms, shafts, bearings, hubs, wheels, disks, gears, or other structures. In the SUMMiT V™ fabrication process, the sacrificial material may comprise sacrificial oxide and release a wet etch in HF based chemistry to complete processing.

At step 604, post assembly methods construct of out-of-plane features using parts patterned in-plane and released. The post assembly methods may comprise direct (by turning) or other rotation of structures, such as pins, arms, bearings, shafts, columns, cylinders and/or grooves in-plane from in-plane to out-of-plane, from out-of-plane to in-plane, and/or between different orientations. Precise positioning in 3-D coordinates for such out-of-plane features may be provided by the post assembly methods. For example, alignment, 3-D positioning and/or guide systems, such as those described in connection with the micro blender 200 and micro vehicle 300 may be provided.

Post assembly uses on-chip actuation, such as MEMS actuators, to rotate or otherwise move structures. In one embodiment, structures patterned in-plane are rotated ninety (90) degrees into an out-of-plane orientation. The post assembly method may comprises the "cross-system" described above in connection with FIGS. 2A-H and below in connection with FIGS. 7A-C, the "tweezers-system" described above in connection with FIGS. 3A-E and below in connection with FIGS. 8A-B, or other suitable system for rotating in-plane patterned structures into out-of-plane structures or otherwise constructing of features using parts that are patterned in-plane. The post assembly methods may also receive and rotate a separately constructed device from out-of-plane to in-plane or otherwise. The post assembly methods provide development and construction of new kinds of micro-machinery (e.g., those that use rotating shafts in the plane of the substrate and/or use out-of-plane objects such as wheels).

Figure 7A:
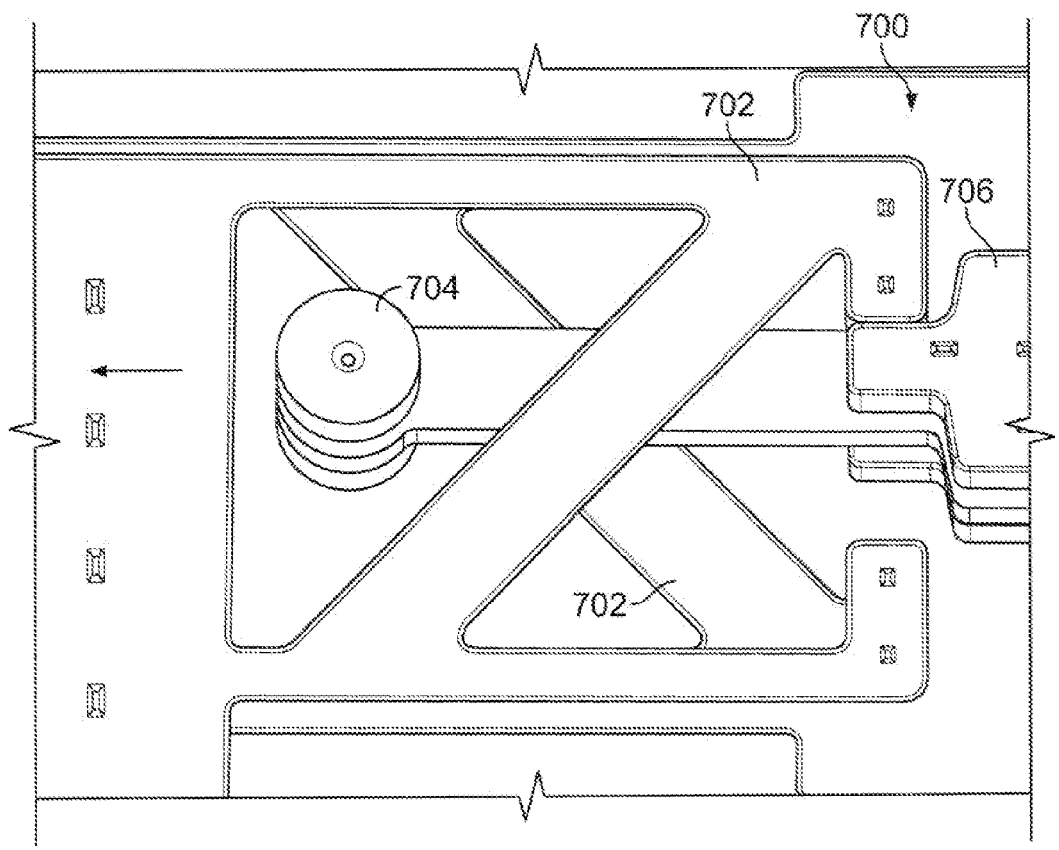
FIGS. 7A-C illustrate a post assembly cross-system method in accordance with one embodiment of the disclosure.
Figure 7B:
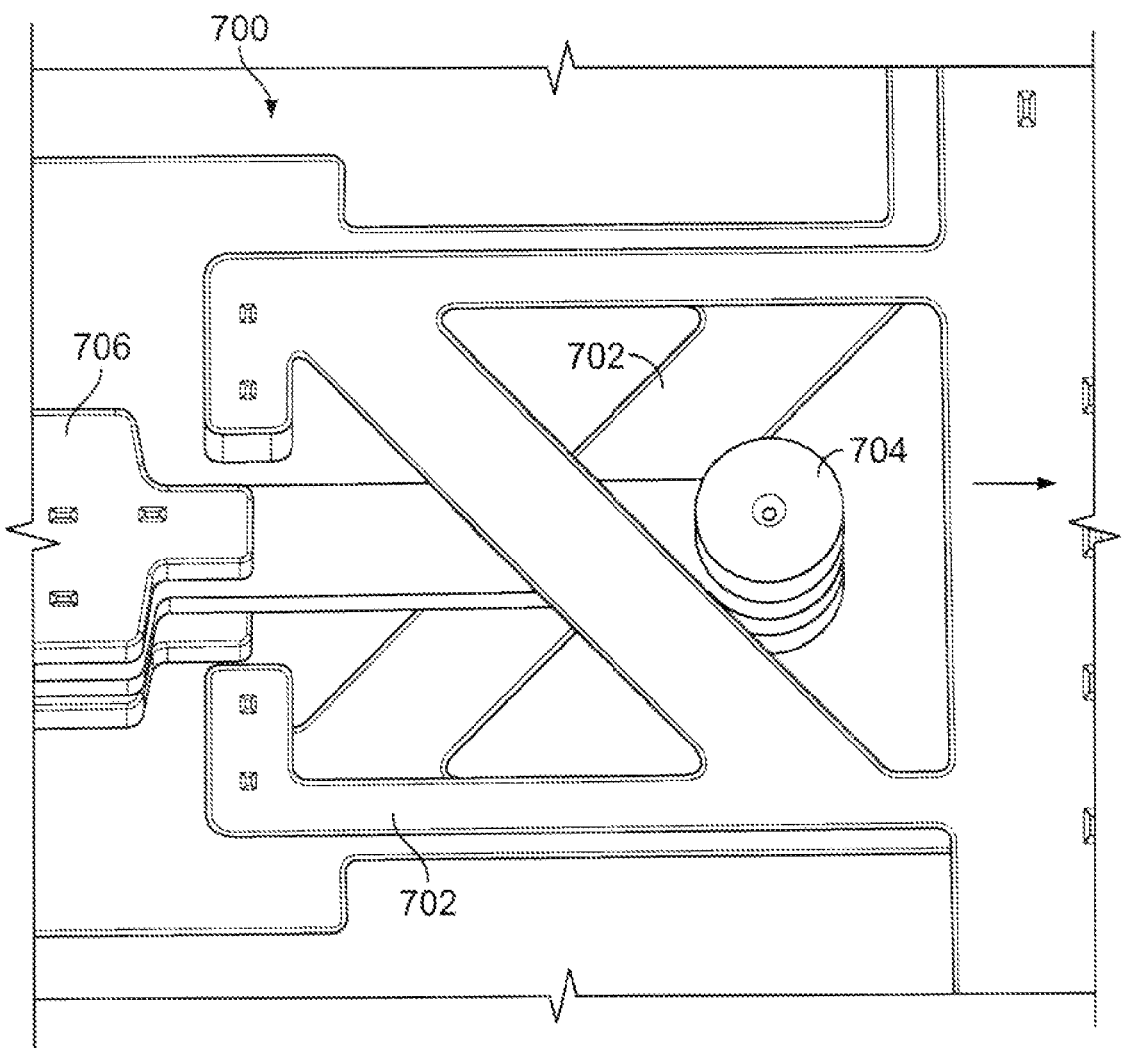
Figure 7C:
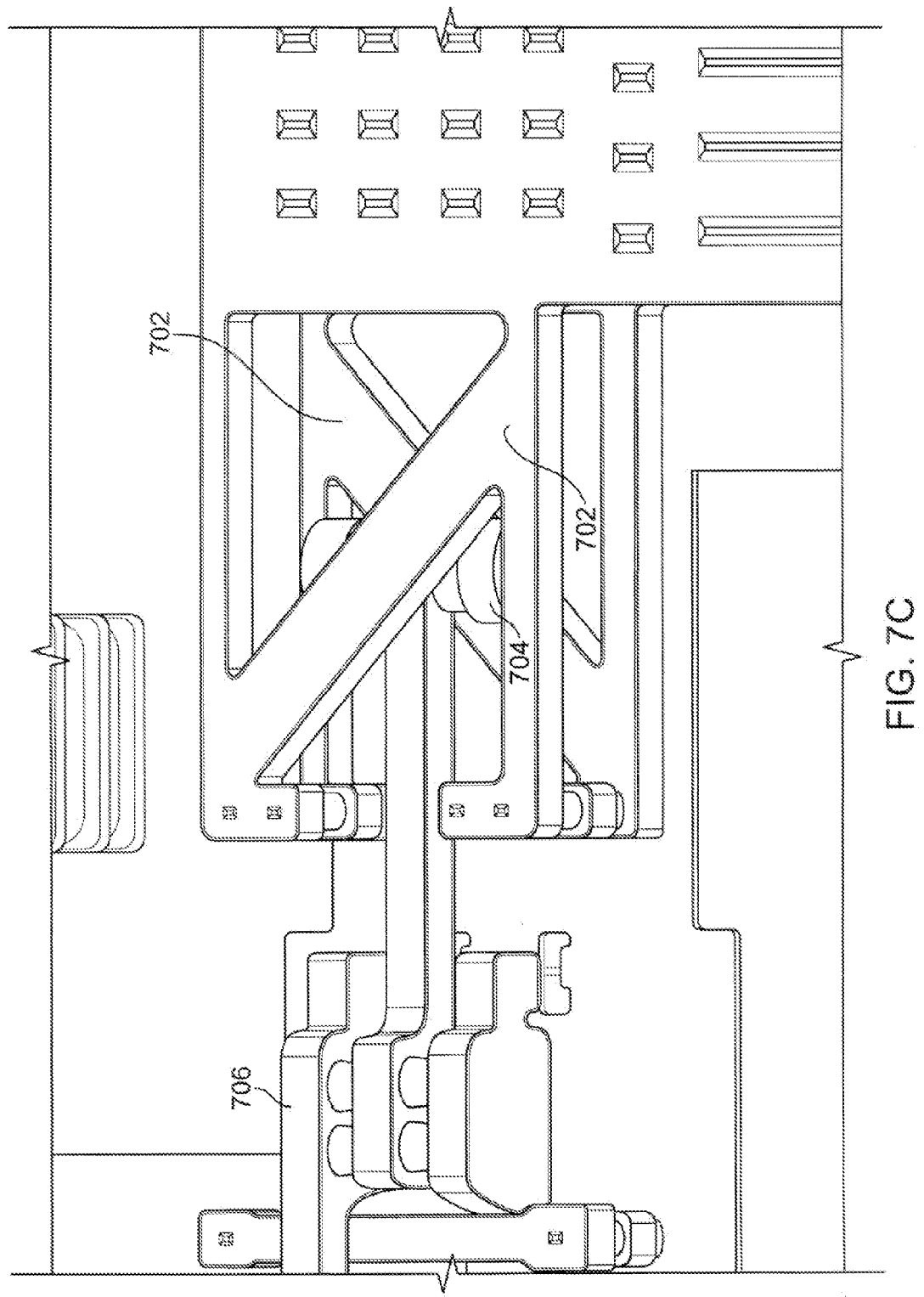

FIGS. 7A-C illustrate a cross-system 700 and method for positioning an element in accordance with one embodiment of the disclosure. The cross-system 700 may be fabricated using SUMMiT V™ and used post fabrication of rotation and precise 3-D positioning of rotated parts. As described above in connection with FIGS. 2A-H, the cross-system 700 may be used, for example, for deploying micro-machinery with in-plane rotating horizontal shafts and out-of-plane bearings formed around the shaft. As described above in connection with FIGS. 3A-E, the cross-system 700 method may also be used for post assembling out-of-plane objects such as wheels to a "systems" platform. The method may be use for other suitable post fabrication assembly and processes. For example, the cross-system 700 may be used during operation of the micro machine 2 to rotate or otherwise move an element from or to a certain position or orientation in response to an input or event. Movement and rotation may comprise back and forth or other cycling movement or rotation of an element into and/or out of one or more positions or orientations. As another example, during start-up or wake-up of the micro machine 2, one or more power, communication or other elements may be rotated or otherwise moved with the cross-system 700 to a start-up or operational position and back to a rest position with the cross-system 700 after processing is complete or the micro machine 2 is powered down.

Referring to FIGS. 7A-B, a cross-system 700 is patterned in the SUMMiT V™ process with an "X" shaped structure 702 using P2 and P4 layers and a cylinder 704 made up of layers P2, P3, and P4. When a force is applied as shown, the P4 layers of the "X" structure 702 strikes the top of the cylinder 704 and the P2 layer strikes the bottom of the cylinder 704, inducing a moment on the cylinder 704, turning the top of the cylinder 704 downward and the bottom of the cylinder 704 upward until the cylinder 704 has rotated ninety (90) degrees as shown in FIG. 7C. As cylinder 704 is rotated, so is any connected structure 706.

For post assembly, a locking mechanism such as described above may be used after rotation and deployment. For operational uses, the locking mechanism may be omitted or may include a selectively releasable lock. For example, a double thermal actuator assembly such as thermal actuator 410 illustrated in FIG. 4A may be used in connection with transmission system 204 in FIGS. 2A and 2B, transmission system 550 in FIG. 5D or transmission system 500 in FIGS. 5A and 5B to rotate an element back and forth.

Figure 8A:
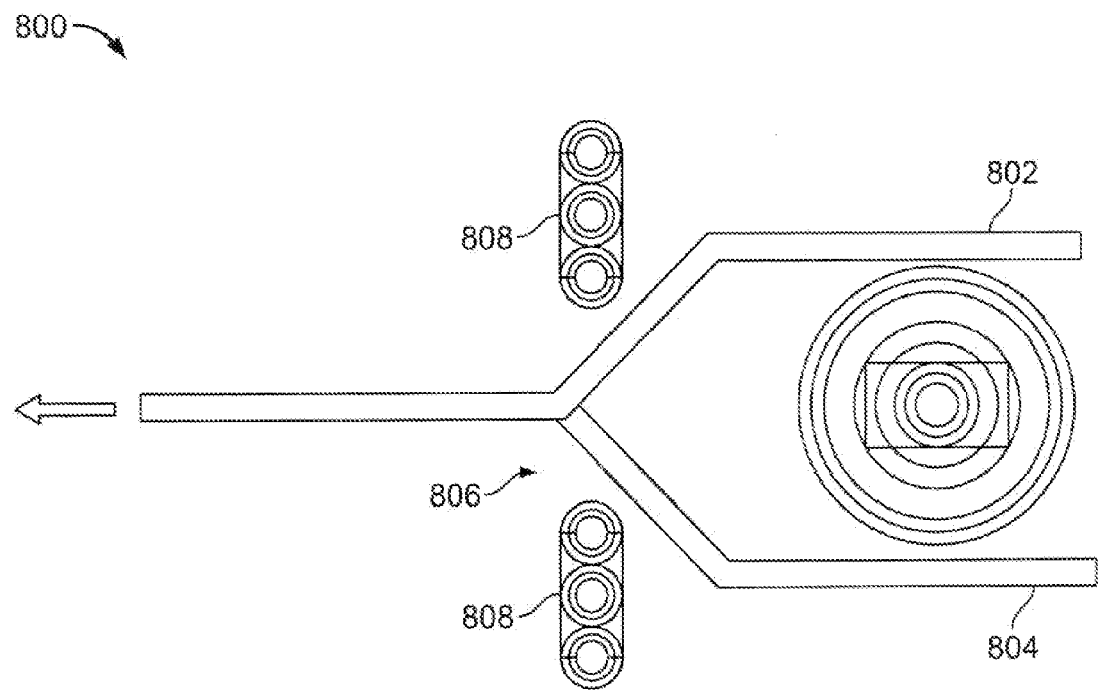
FIGS. 8A-B illustrate a post assembly tweezer-system method in accordance with one embodiment of the disclosure.
Figure 8B:
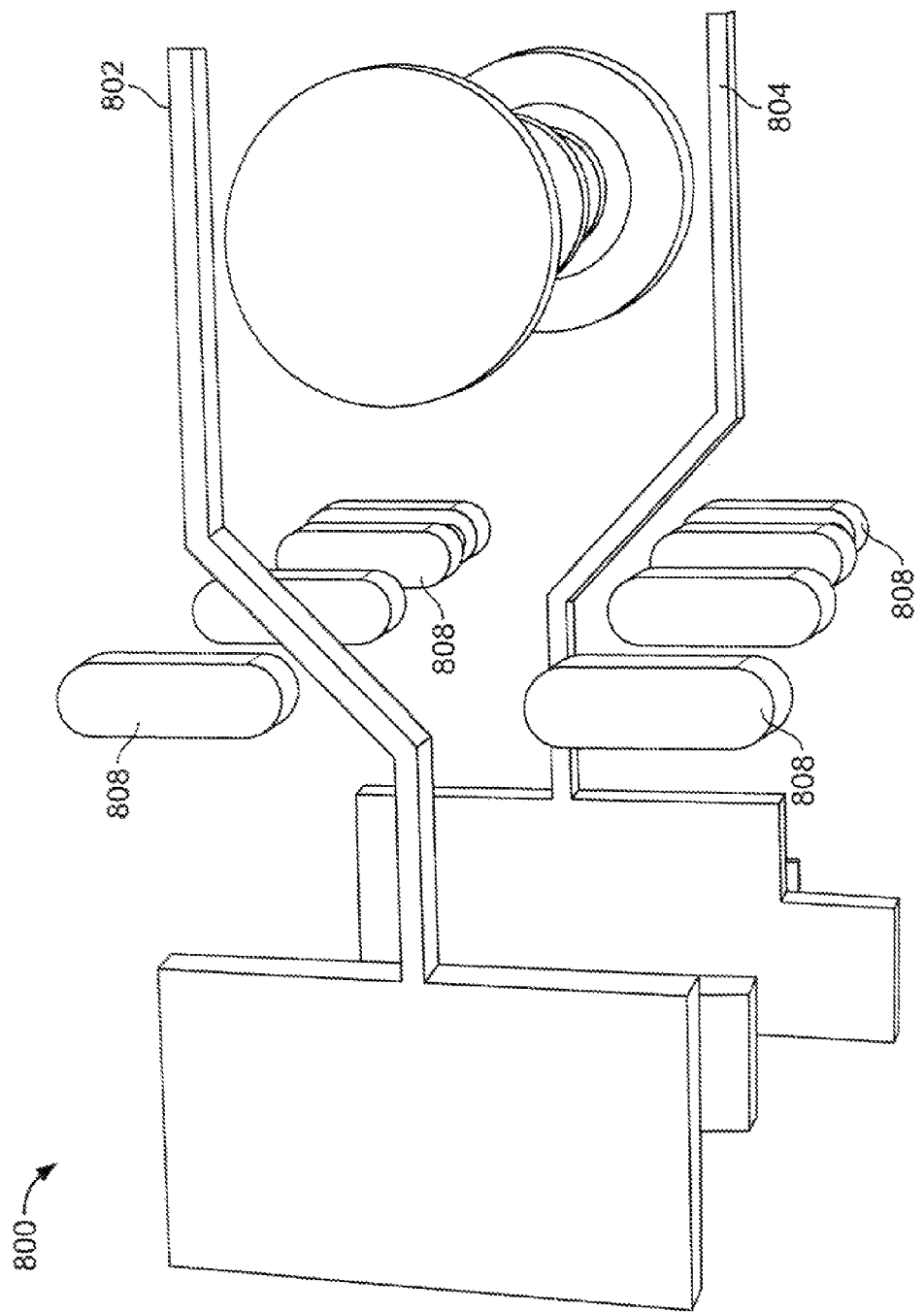

FIGS. 8A-B illustrate a tweezers-system 800 and method for positioning an element in accordance with one embodiment of the disclosure. The tweezers-system 800 may be fabricated using SUMMiT V™ and used post fabrication for rotation and precise 3-D positioning of rotated parts. The tweezers-system 800 may be use for other suitable post fabrication assembly and processes. For example, the tweezers-system 800 may be used during operation of the micro machine 2 to rotate or otherwise move an element from or to a certain position or orientation in response to an input or event. Movement and rotation may comprise movement or rotation of an element into and/or out of one or more positions or orientations. As another example, during start-up or wake-up of the micro machine 2, one or more power, communication or other elements may be rotated or otherwise moved with the tweezers-system 800 to a start-up or operational position and back to a rest position after processing is complete or the micro machine 2 is powered down. Movement back may be done by the use of springs and jacking system such as the types described in connection with FIG. 10 or otherwise.

Referring to FIGS. 8A-B, tweezers-system 800 is patterned in the SUMMiT V™ process with a first prong 802 patterned in-plane using polysilicon layer P4 and a second prong 804 patterned in-plane using polysilicon layer P2. As the two prongs 802 and 804 of the tweezers are pulled in the direction of the shown force, the prongs 802 and 804 are squeezed through a narrow gap 806 between fixed objects 808. As the prongs 802 and 084 are squeezed together, prong 802 places a force on the P4 layer of the micro-wheel and prong 804 places a force on the P2 layer of the micro-wheel, creating a moment on the micro-size wheel which rotates ninety (90) degrees as the tweezers are pulled through the narrow gap 806. As discussed above in connection with the micro vehicle 300, the cross-system 700 can also be used to deploy micro-wheels, but leaves the "T-shaped" cylinder piece which does not happen with the tweezers-system 800.

Figure 9C:
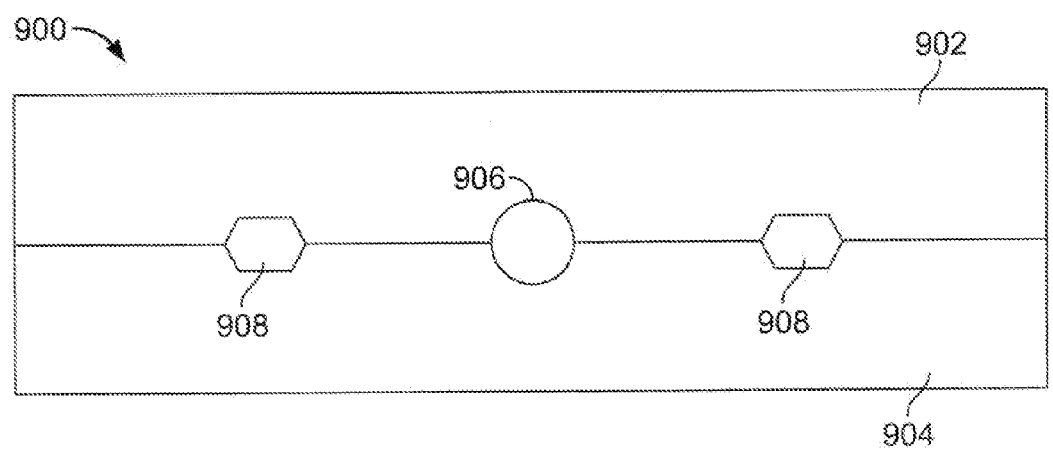
FIGS. 9A-C further illustrate post assembly of a bearing in accordance with one embodiment of the disclosure.
Figure 9A:
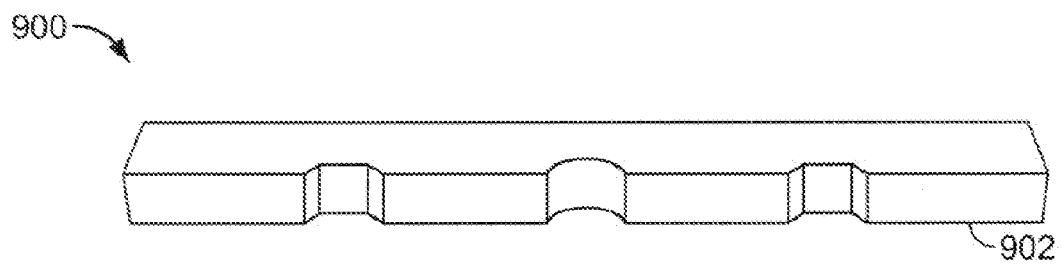
Figure 9A:
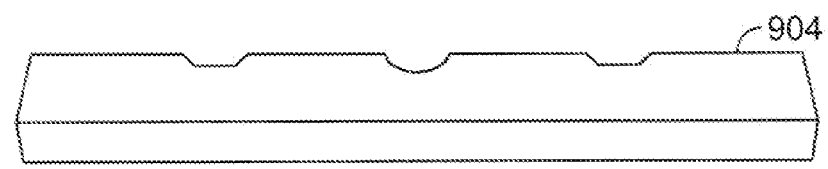
Figure 9B:
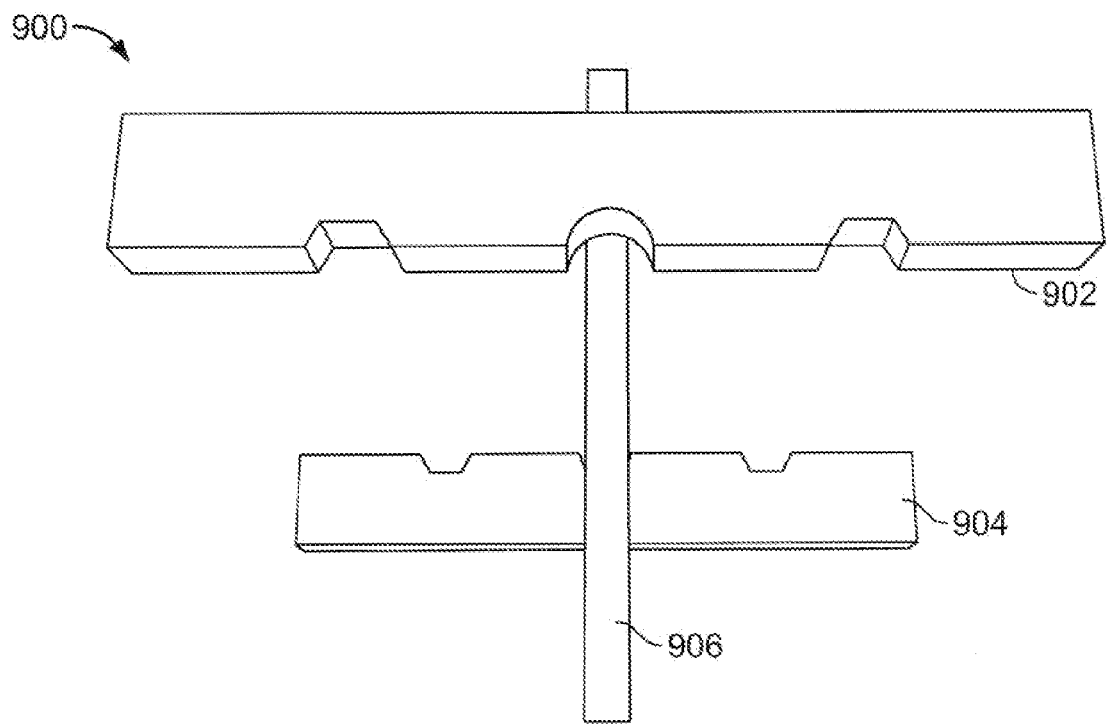

FIGS. 9A-C illustrate a bearing system 900 and method in accordance with one embodiment of the disclosure. The bearing system 900 may be used for post assembly bearing construction. In this embodiment, the bearing 900 is fabricated using SUMMiT V™ and provides for precise 3-D positioning of rotated parts. As described above in connection with FIGS. 2A-H, the bearing 900 may be used, for example, for developing micro-machinery with in-plane rotating horizontal shafts. The method may be use for or with other suitable on-chip actuated, post assembly fabrication assembly and processes.

Referring to FIGS. 9A-C, the bearing system 900 is patterned in the SUMMiT V™ process with one-half of the bearing patterned in structure 902 which may be the polysilicon P4 layer and the other-half patterned in structure 904 which may be the polysilicon P2 layer. The shaft 906 and alignment elements 908 may be patterned in the polysilicon P3 layer. After release of parts, on-chip actuated post assembly rotates the two structures 902 and 904 with bearing halves ninety (90) degrees so that the two bearing halves (patterned in-plane) end up in an out-of-plane orientation and so that the two structures 902 and 904 and included halves encircle the shaft 906 and alignment elements 908 which have been patterned in the polysilicon P3 layer. For this, the P4 structure 902 may be rotated downward ninety (90) degrees and the P2 structure 904 may be rotated upward ninety (90) degrees, resulting in the out-of-plane orientation with both bearing halves fitting well together as depicted in FIG. 9C. In other embodiments, the bearing halves may be or otherwise configured and rotated in the opposite directions with the P4 half rotated upward and the P2 half rotated downward. In addition, different types of structures may be fabricated on structures 902 and 904 and assembled or used in operation by rotation of the structures using the cross-system 700, tweezers-system 800 or other positioning system.

Figure 10:
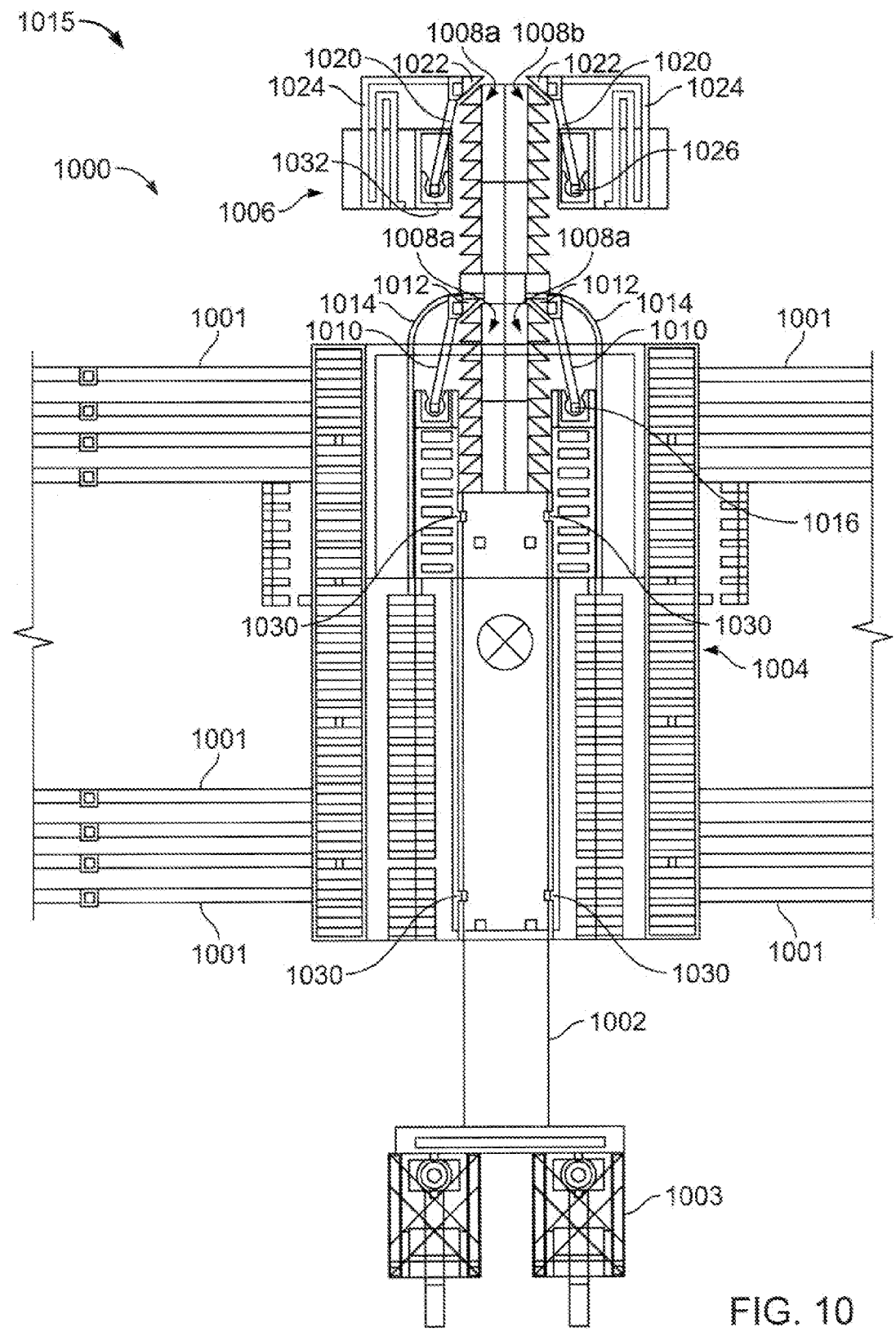
FIG. 10 illustrates a post assembly jacking system in accordance with one embodiment of the disclosure.

FIG. 10 illustrates a jacking system 1000 and method for positioning a micro or other movable element in accordance with one embodiment of the disclosure. The jacking system 1000 may be used in connection with thermal actuators 1001 to perform on-chip actuated post assembly and/or to clear operational elements from post assembly structures. The jacking system 1000 may be omitted and post assembly performed with only the thermal actuators or with thermal actuators in connection with couplers or multipliers. In addition, the jacking system 1000 may be used operationally as part of the micro machine 2. For example, the jacking system 1000 may be extended in response to an input or event to perform a function or to extend or retract a device to perform a function. Any post fabrication post assembly system operable to move or rotate a structure may be used, such as the cross-system or tweezers-system.

Referring to FIG. 10, the jacking system 1000 may include a plunger 1002, a cranking system 1004 for moving the plunger 1002, and a latching system 1006 for holding the plunger 1002. The plunger 1002 is mechanically coupled to the cross-system 700, tweezers-system 800, or other post assembly or operation deployment system 1003.

The plunger 1002 may include one or more single, double or multiple sided racks of teeth 1008, or notches, for engagement by the cranking system 1004 and the latching system 1006. In a particular embodiment, a first rack of teeth 1008a may be engaged by the cranking system 1004. A second rack of teeth 1008b may be engaged by the latching system 1006.

The cranking system 1004 is anchored to thermal actuators 1001. The cranking system 1004 is coupled to the plunger 1002 by one or more cranking arms 1010 rotating about pivots 1016. The cranking arms 1010 each include one or more teeth 1012 configured to engage teeth racks 1008a. The cranking arms 1010 may be biased toward the plunger 1002 by tension springs 1014. In one embodiment, the stiffness of the tension springs 1014 may be set based on the length of the tension spring 1014 with the stiffness lessening as the length increases. In one embodiment, the cranking system 1004 may include slight protrusions 1030 to control alignment and tolerance between the cranking system 1004 and the plunger 1002. The tolerance, in a specific embodiment, may be fifty (50) nanometers. Also, as above, dimples may be used in to reduce friction as the plunger 1002 and cranking system 1004 move and they may be used, for example, to limit its vertical movement to several hundred nanometers tolerance.

The latching system 1006 is anchored to the substrate 1015. The latching system 1006 is coupled to the plunger 1002 by one or more latching arms 1020 rotating about pivots 1026. The latching arms 1020 each include one or more teeth 1022 configured to engage teeth racks 1008b. The latching arms 1020 may be biased toward the plunger 1002 by tension springs 1024. The stiffness of the tension springs 1024 may be set based on the length of the tension spring 1024 with the stiffness lessening as the length increases. In one embodiment, tension springs 1014 and 1024 may have the same or substantially the same stiffness to provide balance between the cranking and latching elements.

In the SUMMIT V™ embodiment, the tension springs 1014 and 1024 may be fabricated in the P3 layer without any attachment to the underlying P2 layer except at its cantilevered end. In this embodiment, pivots 1016 and 1026 may comprise a dimple extending below P3, for example, 1.7 microns below P3 to within 0.3 microns above P2. A clearance of one micron, for example, may be provided between each pivot 1016 or 1026 and the surrounding socket 1032.

In operation, when the thermal actuators 1001 actuate, the cranking arms 1010 push the plunger 1002 outward from deployment system 1003 where the plunger 1002 is prevented from reverse motion by the latching arms 1020. As the thermal actuators 1001 and cranking system 1004 return to their rest positions, the latching arms 1020 continue to hold the plunger 1002 in place. As the thermal actuators 1001 continue to be cycled, the cranking arms 1010 incrementally push the plunger 1002 outward one or more teeth 1008 at a time on each power stroke, where the plunger 1002 is incrementally held by the latching arms 1020. In this way, the elements can be, for example, incrementally moved out-of-plane or on-chip actuated post assembly structures incrementally moved clear of or into operational engagement with operational elements.

Although this disclosure has been described in terms of certain embodiments and generally associated methods, alterations and permutations of these embodiments and methods will be apparent to those skilled in the art. For example, any suitable element, including all those specifically described above, may be rotated, slid, pushed, pulled, raised, lowered, or otherwise moved from in-plane to out-of-plane, from out-of-plane to in-plane, from in-plane to otherwise in-plane, from out-of-plane to otherwise out-of-plane, from any first orientation to any second orientation. Such movement may move elements into or out of physical, electrical, or operational engagement or communication with other elements. In addition, movement may be operational movement in addition to or in place of deployment movement. Accordingly, the above description of example embodiments does not define or constrain this disclosure. Other changes, substitutions, and alterations are also possible without departing from the spirit and scope of this disclosure.

What is claimed is:

1. A micro transport machine, comprising:
   a substrate;
   a micro device comprising: a drive component responsive to a wireless power source;
   a rotatable wheel that is coupled to a body axle;
   and a micro steerable machine;
   wherein the micro device, the micro steerable machine, and the drive component are operable to move laterally between a plurality of disparate areas on the substrate.

2. The micro transport machine of claim 1, the micro device fabricated on the substrate.

3. The micro transport machine of claim 1, the micro device released from the substrate post fabrication.

4. The micro transport machine of claim 1, wherein the micro steerable machine that can be steered via electromagnetic fields.

5. The micro transport machine of claim 1, the micro device operable to move elements on the substrate.

6. The micro transport machine of claim 1, the micro device operable to move to different levels of the substrate.

7. The micro transport machine of claim 1, the wireless power source comprising one of an electrostatic, electromagnetic, and electrokinetic fields.

8. The micro transport machine of claim 1, the drive component comprising a magnet coupled to a body of the micro device.

9. A micro transport machine, comprising:
   a substrate;
   a movable device comprising a drive component responsive to a wireless power source, the movable device operable to move between a plurality of disparate areas on the substrate;
   a micro vehicle including a plurality of rotatable wheels; and
   a bi-electrode set of tracks for the micro vehicle to travel on.

10. The micro transport machine of claim 9, wherein the rotatable wheels are out-of-plane of the substrate.

11. The micro transport machine of claim 9, wherein the micro vehicle travels using traveling wave dielectrophoresis.

\* \* \* \* \*